US011144820B2

(12) United States Patent
Chung et al.

(10) Patent No.: US 11,144,820 B2
(45) Date of Patent: Oct. 12, 2021

(54) HARDWARE NODE WITH POSITION-DEPENDENT MEMORIES FOR NEURAL NETWORK PROCESSING

(71) Applicant: Microsoft Technology Licensing, LLC, Redmond, WA (US)

(72) Inventors: Eric S. Chung, Woodinville, WA (US); Douglas C. Burger, Bellevue, WA (US); Jeremy Fowers, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1009 days.

(21) Appl. No.: 15/637,426

(22) Filed: Jun. 29, 2017

(65) Prior Publication Data
US 2018/0247185 A1 Aug. 30, 2018

Related U.S. Application Data

(60) Provisional application No. 62/465,063, filed on Feb. 28, 2017.

(51) Int. Cl.
*G06N 3/063* (2006.01)
*G06N 3/04* (2006.01)
(Continued)

(52) U.S. Cl.
CPC .......... *G06N 3/063* (2013.01); *G06F 9/3867* (2013.01); *G06N 3/04* (2013.01); *G06N 3/0481* (2013.01); *G06F 17/16* (2013.01)

(58) Field of Classification Search
CPC .... G06F 9/3836; G06F 9/3867; G06F 9/3826; G06F 9/3893–3897; G06N 3/04; G06N 3/0454; G06N 3/0481; G06N 3/063
See application file for complete search history.

(56) References Cited

U.S. PATENT DOCUMENTS 5,216,751 A    6/1993   Gardner et al.
5,337,395 A * 8/1994   Vassiliadis .............. G06N 3/04
                                                    706/42
(Continued)

FOREIGN PATENT DOCUMENTS

EP         0569312 A2    11/1993

OTHER PUBLICATIONS

Qiao, et al., "FPGA-Accelerated Deep Convolutional Neural Networks for High Throughput and Energy Efficiency", In Publication of Wiley, Jan. 1, 2016, 20 pages.
(Continued)

*Primary Examiner* — Kamran Afshar
*Assistant Examiner* — Benjamin J Buss
(74) *Attorney, Agent, or Firm* — Ranjeev Singh; Singh Law, PLLC

(57) ABSTRACT

Processors and methods for neural network processing are provided. A method in a processor including a pipeline having a matrix vector unit (MVU), a first multifunction unit connected to receive an input from the matrix vector unit, a second multifunction unit connected to receive an output from the first multifunction unit, and a third multifunction unit connected to receive an output from the second multifunction unit is provided. The method includes decoding a chain of instructions received via an input queue, where the chain of instructions comprises a first instruction that can only be processed by the matrix vector unit and a sequence of instructions that can only be processed by a multifunction unit. The method includes processing the first instruction using the MVU and processing each of instructions in the sequence of instructions depending upon a position of the each of instructions in the sequence of instructions.

20 Claims, 16 Drawing Sheets

(51) Int. Cl.
  *G06F 9/38* (2018.01)
  *G06F 17/16* (2006.01)

(56) References Cited

U.S. PATENT DOCUMENTS

| | | | |
|---|---|---|---|
| 5,896,518 A * | 4/1999 | Yao | G06F 9/30149 712/208 |
| 5,930,492 A * | 7/1999 | Lynch | G06F 9/30167 712/215 |
| 6,249,857 B1 | 6/2001 | Klapman et al. | |
| 6,292,886 B1 | 9/2001 | Makineni et al. | |
| 6,539,368 B1 | 3/2003 | Chernikov et al. | |
| 10,127,495 B1 | 11/2018 | Bopardikar et al. | |
| 2002/0087793 A1* | 7/2002 | Samra | G06F 9/384 711/125 |
| 2004/0148493 A1* | 7/2004 | Chu | G06F 9/3836 712/214 |
| 2007/0094481 A1 | 4/2007 | Snook et al. | |
| 2010/0077177 A1 | 3/2010 | Luick | |
| 2013/0212917 A1 | 8/2013 | Gao et al. | |
| 2014/0133246 A1* | 5/2014 | Kumar | G11C 7/1069 365/189.02 |
| 2015/0039855 A1* | 2/2015 | Pechanek | G06F 9/30181 712/11 |
| 2015/0339570 A1* | 11/2015 | Scheffler | G06N 3/04 706/16 |
| 2016/0099010 A1* | 4/2016 | Sainath | G06N 3/0445 704/232 |
| 2016/0124651 A1 | 5/2016 | Sankaranarayanan et al. | |
| 2016/0267380 A1* | 9/2016 | Gemello | G06N 3/084 |
| 2016/0364241 A1* | 12/2016 | Mcconnell | G06F 9/3013 |
| 2016/0378661 A1* | 12/2016 | Gray | G06F 11/3433 712/237 |
| 2016/0379109 A1 | 12/2016 | Chung et al. | |
| 2016/0379115 A1 | 12/2016 | Burger et al. | |
| 2017/0060579 A1* | 3/2017 | Vincent | G06F 9/322 |
| 2017/0102950 A1* | 4/2017 | Chamberlain | G06F 3/0655 |
| 2018/0005082 A1* | 1/2018 | Bluche | G06K 9/00409 |
| 2018/0191642 A1 | 7/2018 | Biederman et al. | |
| 2018/0246853 A1 | 8/2018 | Fowers et al. | |
| 2018/0247186 A1 | 8/2018 | Fowers et al. | |
| 2018/0247187 A1 | 8/2018 | Chung et al. | |
| 2018/0247190 A1 | 8/2018 | Chung et al. | |
| 2019/0050224 A1* | 2/2019 | Bajic | G06N 3/08 |
| 2019/0265950 A1 | 8/2019 | Heeger et al. | |
| 2019/0266998 A1 | 8/2019 | Liang et al. | |

OTHER PUBLICATIONS

Ovtcharov, et al., "Accelerating Deep Convolutional Neural Networks Using Specialized Hardware", In Microsoft Research Whitepaper, Feb. 22, 2015, pp. 1-4.
Wang, et al., "PipeCNN: An OpenCL-Based FPGA Accelerator for Large-Scale Convolution Neuron Networks", In Journal of the Computing Research Repository, Nov. 2016, 5 pages.
Zhang, et al., "Optimizing FPGA-Based Accelerator Design for Deep Convolutional Neural Networks", In Proceedings pf the ACM/SIGDA International Symposium on Field-Programmable Gate Arrays, Feb. 22, 2015, 10 pages.
Sak, et al., "Long Short-Term Memory Recurrent Neural Network Architectures for Large Scale Acoustic Modeling", In Proceedings of the 15th Annual Conference of the International Speech Communication Association, Sep. 14, 2014, pp. 338-342.
Lipton, et al., "A Critical Review of Recurrent Neural Networks for Sequence Learning", In Journal of the Computing Research Repsoitory, Jun. 5, 2015, pp. 1-38.
Zen, et al., "Unidirectional Long Short-Term Memory Recurrent Neural Network with Recurrent Output Layer for Low-Latency Speech Synthesis", In Proceedings of IEEE International Conference on Acoustics, Speech and Signal Processing, Apr. 19, 2015, pp. 1-5.
Qiu, et al., "Going Deeper with Embedded FPGA Platform for Convolutional Neural Network", In Proceedings of the ACM/SIGDA International Symposium on Field-Programmable Gate Arrays, Feb. 21, 2016, pp. 26-35.
Guan, et al., "FPGA-Based Accelerator for Long Short-Term Memory Recurrent Neural Networks", In Proceedings of 22nd Asia and South Pacific Design Automation Conference, Jan. 16, 2017, 6 pages.
Fowers, Jeremy, "A Framework for Dynamic, Transparent, and Adaptive Optimizations in Heterogeneous Systems", In a dissertation presented to University of Florida, 2014, 135 pages.
Fowers, et al., "A Framework for Dynamic Parallelization of FPGA-Accelerated Applications", In Proceedings of the 17th International Workshop on Software and Compilers for Embedded Systems, 2014, 10 pages.
Kim, et al., "A Fully Pipelined FPGA Architecture of a Factored Restricted Boltzmann Machine Artificial Neural Network", In ACM Transactions on Reconfigurable Technology and Systems, vol. 7, No. 1, Feb. 1, 2014, 23 Pages.
Gironés, et al., "FPGA Implementation of a Pipelined On-Line Backpropagation", In Journal of VLSI Signal Processing Systems for Signal, Image and Video Technology, vol. 40, No. 2, Jun. 1, 2005, 25 Pages.
Moreau, et al., "SNNAP: Approximate Computing on Programmable SoCs via Neural Acceleration", In Proceedings of the 21st International Symposium on High Performance Computer Architecture, Feb. 7, 2015, 12 Pages.
Shen, et al., "Maximizing CNN Accelerator Efficiency Through Resource Partitioning", In Proceedings of the 44th Annual International Symposium on Computer Architecture, Jun. 30, 2016, 12 Pages.
Umuroglu, et al., "FINN: A Framework for Fast, Scalable Binarized Neural Network Inference", In Proceedings of the ACM/SIGDA International Symposium on Field-Programmable Gate Arrays, Dec. 1, 2016, 10 Pages.
Sharma, et al., "From High-Level Deep Neural Models to FPGAs", In the 49th Annual IEEE/ACM International Symposium on Microarchitectur, Oct. 15, 2016, 12 Pages.
"International Search Report and Written Opinion Issued in PCT Application No. PCT/US18/017311", dated Apr. 20, 2018, 12 Pages.
"International Search Report and Written Opinion Issued in PCT Application No. PCT/US18/017312", dated Apr. 20, 2018, 13 Pages.
"International Search Report and Written Opinion Issued in PCT Application No. PCT/US18/017310", dated May 2, 2018, 13 Pages.
"International Search Report and Written Opinion Issued in PCT Application No. PCT/US18/017309", dated May 2, 2018, 14 Pages.
"International Search Report and Written Opinion Issued in PCT Application No. PCT/US18/019116", dated May 9, 2018, 13 Pages.
"Non Final Office Action Issued in U.S. Appl. No. 15/637,543", dated Jan. 21, 2021, 26 Pages.
Liu, et al., "Cambricon: An Instruction Set Architecture for Neural Networks", In Proceedings of ACM/IEEE 43rd Annual International Symposium on Computer Architecture, Jun. 18, 2016, pp. 393-405.
"Non Final Office Action Issued in U.S. Appl. No. 15/637,664", dated Mar. 29, 2021, 12 Pages.
Zhang, et al., "Feedforward Sequential Memory Networks: A New Structure to Learn Long-Term Dependency", In Computer Repository of https://arxiv.org/pdf/1512.08301 pdf, Jan. 2016, 12 Pages.
"Office Action Issued in European Patent Application No. 18706364.9", dated Jun. 15, 2021, 8 Pages.
"Office Action Issued in European Patent Application No. 18706932.3", dated Jun. 14, 2021, 10 Pages.
"Office Action Issued in European Patent Application No. 18709200.2", dated Jun. 14, 2021, 10 Pages.
Pham, et al., "NeuFlow: Dataflow Vision Processing System-on-a-Chip", In IEEE 55th International Midwest Symposium on Circuits and Systems, Aug. 5, 2012, pp. 1044-1047.

(56) References Cited

OTHER PUBLICATIONS

"Office Action Issued in European Patent Application No. 18709852. 0", dated Jul. 1, 2021, 10 Pages.

* cited by examiner

1520 — DECODING A CHAN OF INSTRUCTIONS RECEIVED VIA AN INPUT QUEUE, WHERE THE CHAIN OF INSTRUCTIONS COMPRISES A FIRST INSTRUCTION THAT CAN ONLY BE PROCESSED BY A MATRIX VECTOR UNIT AND SEQUENCE OF INSTRUCTIONS THAT CAN ONLY BE PROCESSED BY A MULTIFUNCTION UNIT

1530 — PROCESSING THE FIRST INSTRUCTION USING THE MATRIX VECTOR UNIT AND PROCESSING EACH OF INSTRUCTIONS IN THE SEQUENCE OF INSTRUCTIONS DEPENDING UPON A POSITION OF EACH OF THE INSTRUCTIONS IN THE SEQUENCE OF INSTRUCTIONS, SUCH THAT AN INSTRUCTION THAT IS IN A FIRST POSITION IN THE SEQUENCE OF INSTRUCTIONS IS PROCESSED BY THE FIRST MULTIFUNCTION UNIT, AN INSTRUCTION THAT IS IN A SECOND POSITION IN THE SEQUENCE OF INSTRUCTIONS IS PROCESSED BY THE SECOND MULTIFUNCTION UNIT, AND AN INSTRUCTION THAT IS IN A THIRD POSITION IN THE SEQUENCE OF INSTRUCTIONS IS PROCESSED BY THE THIRD MULTIFUNCTION UNIT

HARDWARE NODE WITH POSITION-DEPENDENT MEMORIES FOR NEURAL NETWORK PROCESSING

CROSS-REFERENCE TO A RELATED APPLICATION

This application claims priority to U.S. Provisional Application No. 62/465,063, filed Feb. 28, 2017, titled "NEURAL NETWORK PROCESSING USING DISTRIBUTED PROGRAMMABLE HARDWARE NODES," the entire contents of which are hereby incorporated herein by reference.

BACKGROUND

Neural network technology is used to perform complex tasks such as reading comprehension, language translation, or speech recognition. Although neural networks can perform such tasks, they are expensive to deploy using general purpose CPUs or general purpose GPUs. In addition, while the GPUs provide increased throughput relative to the CPUs, they have poor latency.

SUMMARY

In one example, the present disclosure relates to a method in a processor including a pipeline for processing instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The method may include decoding a chain of instructions received via an input queue, wherein the chain of instructions comprises a first instruction that can only be processed by the matrix vector unit and a sequence of instructions that can only be processed by a multifunction unit. The method may further include processing the first instruction using the matrix vector unit and processing each of instructions in the sequence of instructions depending upon a position of the each of instructions in the sequence of instructions, such that an instruction that is in a first position in the sequence of the plurality of instructions is processed by the first multifunction unit, an instruction that is in a second position in the sequence of instructions is processed by the second multifunction unit, and an instruction that is in a third position in the sequence of instructions is processed by the third multifunction unit.

In another example, the present disclosure relates to a processor including a pipeline configured to process instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The processor may further include a decoder configured to decode a chain of instructions received via an input queue, where the chain of instructions comprises a first instruction that can only be processed by the matrix vector unit and a sequence of instructions that can only be processed by a multifunction unit. The processor may further include a controller configured to map the first instruction for processing using the matrix vector unit and map each of instructions in the sequence of instructions for processing depending upon a position of the each of instructions in the sequence of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

In yet another example, the present disclosure relates to a system including an input message processor configured to process incoming messages, wherein the input message processor is further configured to split the incoming messages into a first set of messages and a second set of messages. The system may further include a scalar processor configured to process both the first set of messages and the second set of messages. The system may further include a scalar processor configured to process the first set of messages and not the second set of messages. The system may further include neural function unit configured to process instructions placed in a plurality of queues by the scalar processor on input data received at least via the second set of messages. The neural function unit may further include a pipeline configured to process the instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The neural function unit may further include a decoder configured to decode a chain of instructions received via an input queue, where the chain of instructions comprises a first instruction that can only be processed by the matrix vector unit and a sequence of instructions that can only be processed by a multifunction unit. The neural function unit may further include a controller configured to map the first instruction for processing using the matrix vector unit and map each of instructions in the sequence of instructions for processing depending upon a position of the each of instructions in the sequence of the plurality of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 15 shows a flow diagram of a method for processing instructions in accordance with one example.

DETAILED DESCRIPTION

Figure 1:
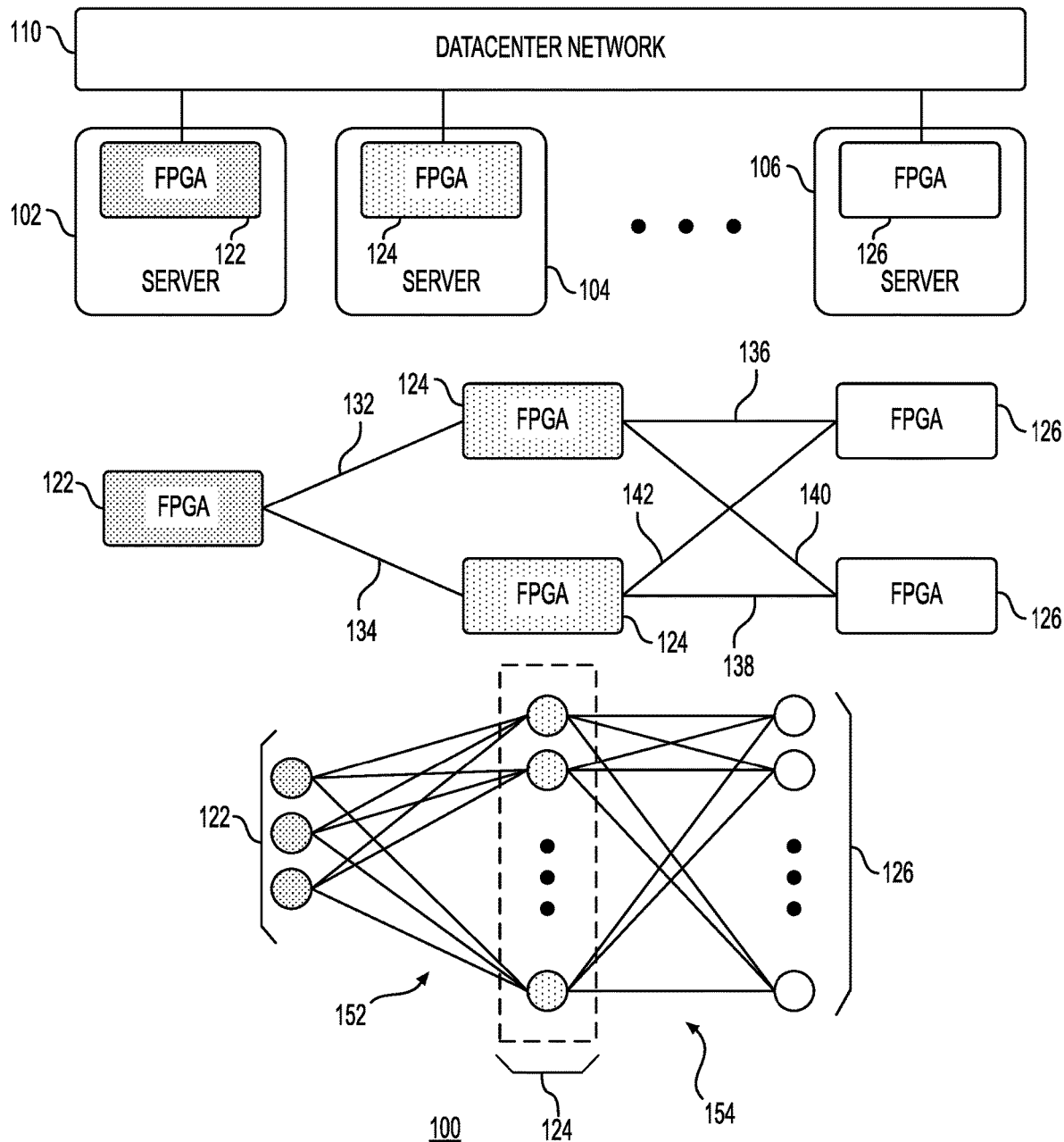
FIG. 1 is a block diagram of a system including nodes interconnected via a datacenter network in accordance with one example.

Examples disclosed in the present disclosure relate to using system, methods, and components for implementing neural network based processing. Certain examples relate to Deep Neural Networks (DNNs). A DNN may be any suitable neural network for deep learning. Additional examples in this disclosure relate to functional units included as part of the nodes used to implement a DNN or a similar neural network. Nodes may be implemented using portions or combinations of Field Programmable Gate Arrays (FPGAs), Application Specific Integrated Circuits (ASICs), Erasable and/or Complex programmable logic devices (PLDs), Programmable Array Logic (PAL) devices, and Generic Array Logic (GAL) devices. An image file may be used to configure or re-configure nodes such as FPGAs. The image file or similar file or program may be delivered via a network link or a local link (e.g., PCIe) from a host CPU. Information included in an image file can be used to program hardware blocks of a node (e.g., logic blocks and reconfigurable interconnects of an FPGA) to implement desired functionality. Desired functionality can be implemented to support any service that can be offered via a combination of computing, networking, and storage resources such as via a data center or other infrastructure for delivering a service.

In one example, the present disclosure relates to a DNN comprising multiple nodes (e.g., FPGAs) or groups of such nodes coupled to each other via a low latency network. A converged platform leveraging hundreds to thousands of such nodes (e.g., FPGAs) may advantageously offer: (1) significantly reduced training times from exploiting parallelism across hundreds of thousands of nodes, (2) enabling new training scenarios such as online learning in-situ on live data, and (3) training models of unprecedented scale while leveraging flexible and fungible homogeneous FPGA resources in a hyper-scale datacenter spanning hundreds of thousands of servers. In one example, such advantages may be obtained by exploiting unconventional data representations that may leverage the architecture of nodes, such as FPGAs.

The described aspects can also be implemented in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly. A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth.

Machine learning services, such as those based on Recurrent Neural Networks (RNNs), Long Short Term Memory (LSTM) neural networks, or Gated Recurrent Unit (GRUs) may be implemented using the systems and nodes described in this disclosure. In one example, the service-related content or other information, such as words, sentences, images, videos, or other such content/information may be translated into a vector representation. The vector representation may correspond to techniques such as RNN, LSTM, or GRU. The deep learning models may be trained off-line before service initialization and then may be deployed using the systems and nodes described in this disclosure. The nodes may be hardware programmable logic devices that could be customized specifically to perform the types of operations that occur in the context of neural networks, such as DNNs. In one example, the state of a neural network model and the parameters used to control the model may be pinned to the on-chip memories of the nodes comprising a distributed hardware platform. The neural network model may be pinned (e.g., preloaded) to the on-chip memories at the service start up time and the contents of the on-chip memories may not be altered unless the model requires alteration or another event that requires reloading the on-chip memories with the model. Thus, in this example, contrary to other arrangements, neural network model may not be accessed from the DRAM associated with the hardware platform, and instead, be loaded directly into the on-chip memories (e.g., SRAMs) of the hardware node. Pinning a model across a distributed set of programmable logic blocks (e.g., FPGA resources) may allow the nodes (e.g., FPGAs) to operate at full capacity and that may advantageously improve the throughput and the latency associated with the service. As an example, even a single request from the service may result in the distributed set of nodes to operate at full capacity and thereby delivering results requested by a user of the service at very low latency.

In one example, the neural network model may comprise of many layers and each layer may be encoded as matrices or vectors of weights expressed in the form of coefficients or constants that have been obtained via off-line training of a neural network. Programmable hardware logic blocks in the nodes may process the matrices or vectors to perform various operations, including multiply, add, and other operations against input vectors representing encoded information related to the service. In one example, the matrices or vectors of weights may be partitioned and pinned across multiple nodes by using techniques such as graph partitioning. As part of this process, a large neural network may be translated into an intermediate representation (e.g., a graph) and then the intermediate representation may be carved into smaller representations (e.g., sub-graphs) and each of the matrices of weights corresponding to each sub-graph may be pinned to a node's on-chip memories. In one example, the models may be translated into fixed-size matrices and vectors. This way, the nodes' resources may operate on the fixed-size matrices and vectors in parallel.

Taking the LSTM example, an LSTM network may comprise a sequence of repeating RNN layers or other types of layers. Each layer of the LSTM network may consume an input at a given time step, e.g., a layer's state from a previous time step, and may produce a new set of outputs or states. In case of using the LSTM, a single chunk of content may be encoded into a single vector or multiple vectors. As an example, a word or a combination of words (e.g., a phrase, a sentence, or a paragraph) may be encoded as a single vector. Each chunk may be encoded into an individual layer (e.g., a particular time step) of an LSTM network. An LSTM layer may be described using a set of equations, such as the ones below:

$$i_t = \sigma(W_{xi} x_t + W_{hi} h_{t-1} + W_{ci} c_{t-1} + b_i)$$

$$f_t = \sigma(W_{xf} x_t + W_{hf} h_{t-1} + W_{cf} c_{t-1} + b_f)$$

$$c_t = f_t c_{t-1} i_t \tan h(W_{xc} x_t + W_{hc} h_{t-1} + b_c)$$

$$o_t = \sigma(W_{xo} x_t + W_{ho} h_{t-1} + W_{co} c_t + b_o)$$

$$h_t = o_t \tan h(c_t)$$

In this example, inside each LSTM layer, the inputs and hidden states may be processed using a combination of vector operations (e.g., dot-product, inner product, or vector addition) and non-linear functions (e.g., sigmoids, hyperbolic and tangents). In certain cases, the most compute intensive operations may arise from the dot products, which may be implemented using dense matrix-vector and matrix-matrix multiplication routines. In one example, the processing of the vector operations and non-linear functions may be performed in parallel.

FIG. 1 is a block diagram of a system 100 including nodes interconnected via a datacenter network 110 in accordance with one example. For example, as shown in FIG. 1, multiple nodes 102, 104, and 106 may be coupled via the datacenter network. Such nodes may be instantiated and used to parallelize multiple layers of a neural network, such as an LSTM network. In one example, each node may be implemented as a server and may further include at least one hardware node (e.g., an FPGA.) Thus, node 102 may include FPGA 122, node 104 may include FPGA 124, and node 106 may include FPGA 126. The FPGAs may be interconnected via a light transport layer protocol based system. In one example, a first instance of FPGA 122 may be coupled via a transport link 132 with a first instance of FPGA 124 and the first instance of FPGA 122 may further be coupled via transport link 134 with the second instance of FPGA 124. The first instance of FPGA 124 may be coupled via a transport link 136 with a first instance of FPGA 126 and the first instance of FPGA 124 may further be coupled via transport link 140 with a first instance of FPGA 126. Similarly, the second instance of FPGA 124 may be coupled via a transport link 142 with the first instance of FPGA 126 and the second instance of FPGA 124 may further be coupled via a transport link 138 with the second instance of FPGA 126. The light transport layer protocol may provide the FPGAs with the ability to transfer or receive packets or other such data from each other via datacenter network 110. The FPGAs may be interconnected in other configurations as well. For example, several instances of FPGA 122 may be coupled via multiple transport links 152 to several instances of FPGA 124. Similarly, several instances of FPGA 124 may be coupled via transport links 154 to several instances of FPGA 126. Although FIG. 1 shows a certain number and arrangement of nodes, including FPGAs, there could be more or fewer number of nodes arranged differently.

Figure 2:
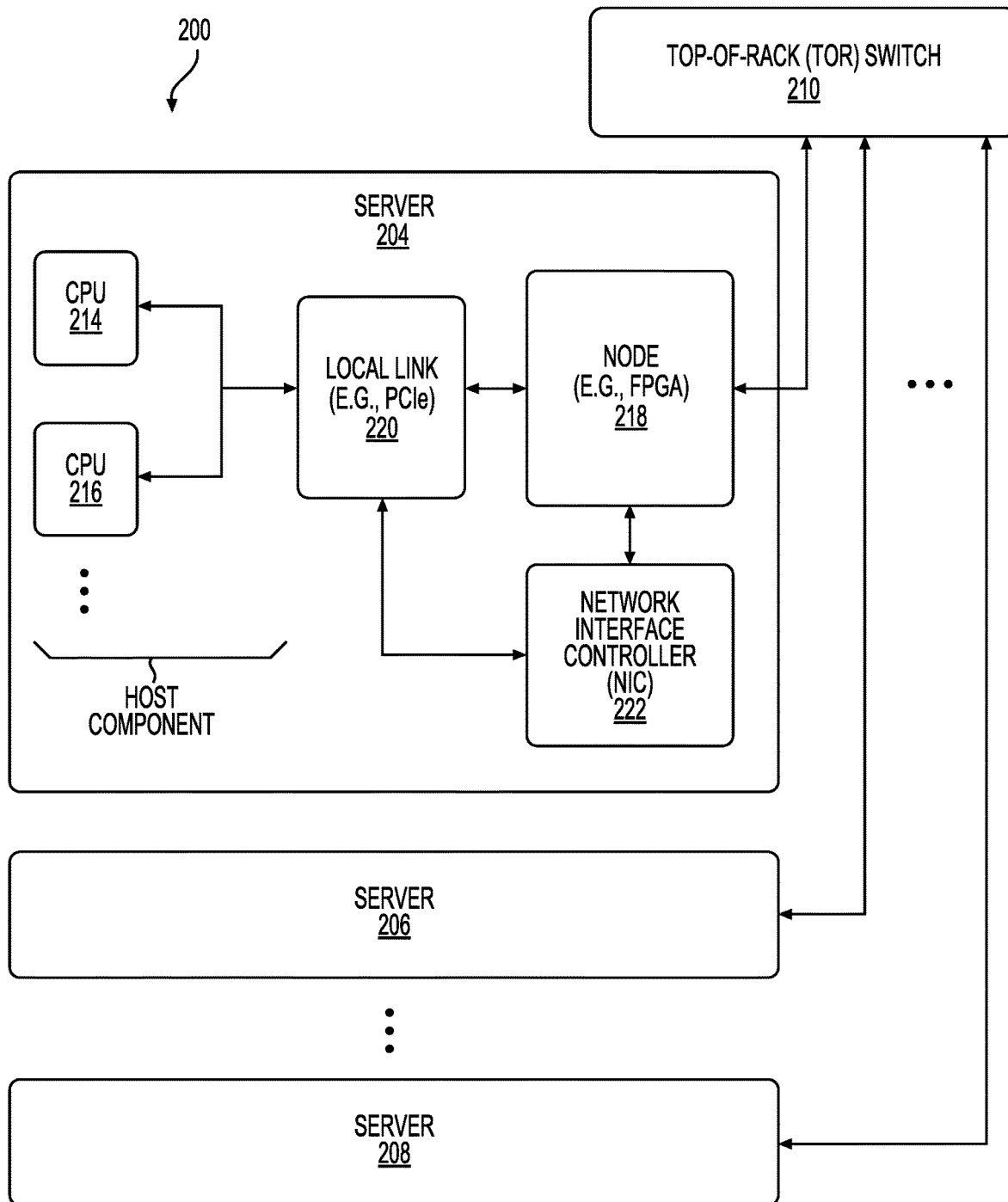
FIG. 2 is a block diagram of a system including distributed nodes in accordance with one example.

FIG. 2 is a block diagram of a system 200 including distributed nodes in accordance with one example. In this example, the multiple nodes may be implemented as a rack of servers in a datacenter. Each of the servers can be coupled to a top-of-rack (TOR) switch. Other racks, although not shown, may have a similar configuration. Each server may include at least one node or multiple nodes. Each node may include a server (e.g., sever 204, sever 206, or server 208) and each server may be coupled to a TOR switch (e.g., TOR switch 210). Server 204 may include a host component including CPUs, such as CPU 214 and CPU 216, which may be coupled via a local link (e.g., PCIe) 220 to a hardware node, e.g., FPGA 218. Each hardware node may also be coupled by way of a network interface controller 222 (e.g., used to communicate across the network infrastructure for the data center). The system shown in FIG. 2 may allow nodes to perform processing on messages that are received from (and/or sent to) TOR switch or other switches. Using this example system, individual nodes may send messages comprising packets directly to each other and thus this may allow the partitioning of even a single neural network across multiple FPGAs without incurring unacceptable latencies. For communicating the nodes may use a lightweight protocol, including, for example, RDMA. Although FIG. 2 shows a certain number of components of the system arranged in a certain manner, there could be more or fewer number of components arranged differently.

Parallelization could also be performed within a layer of a neural network by splitting neural weights across multiple nodes. As an example, a single RNN model (e.g., including LSTM weight matrices) may be partitioned and pinned across multiple nodes. In an implementation of this example, a RNN model may be distributed across the memories (e.g., BRAMs) of each of multiple FPGAs. In this example configuration, each individual FPGA in a multi-stage pipeline may store a fraction of the LSTM weight matrices in a fast on-chip memory (e.g., BRAM). This may advantageously result in a high throughput and yet a low-latency system. At the service start up, the LSTM weight matrices may be decomposed into certain size matrices (e.g., an N by M matrix, where each of N and M is an integer equal to or greater than 8) and then be loaded into the on-chip memories of the FPGAs. A run-time management layer may enable allocation, scheduling, and management of the FPGAs. In one example, each node may be implemented as a HaaS-attached LSTM-focused vector processor based on one or more FPGAs. Each node may be designed to run neural network evaluations as either as a PCIe-attached FPGA or as part of a HaaS pool of FPGAs.

Figure 3:
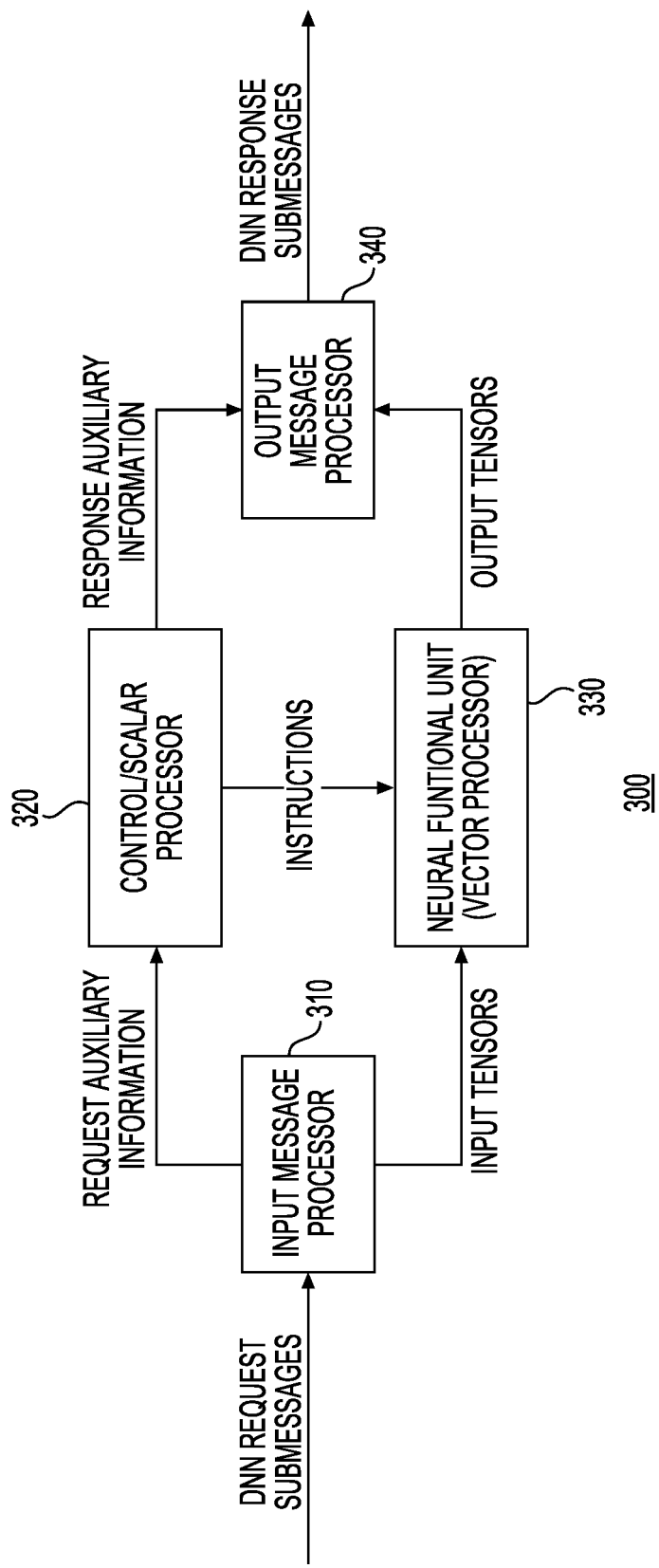
FIG. 3 is a block diagram of a hardware node in accordance with one example.

FIG. 3 is a block diagram of a hardware node 300 in accordance with one example. Each hardware node 300 may include an Input Message Processor (IMP) 310 for receiving messages from other nodes and an Output Message Processor (OMP) 340 for processing outgoing messages to other nodes or components. Each node may further include control/scalar processor (CSP) 320 and a neural functional unit (NFU) 330. Although not shown, the received messages received by a node may be stored in at least two different queues: (1) IMP-to-CSP Auxiliary Queue and (2) IMP-to-NFU Data Queue. Although not shown, the outgoing messages may be stored in at least two different queues: (1) CSP-to-IMP Auxiliary Queue and (2) NFU-to-OMP Data Queue. In this example, the node may accept off-chip messages containing both auxiliary information such as control and scalar data and payload data (e.g., vectors, matrices, or other tensor data structures). The auxiliary information may include a request to perform computationally intensive operations on the payload, and then return a result in the form of an output message. In this example, the incoming messages are handled by a lightweight input message processor (IMP) 310, which sends auxiliary information to control/scalar processor (CSP) 320 (which may be a NIOS-based control processor) and payload data (e.g., input tensors) to neural functional unit (NFU) 330, which may be implemented as a matrix-vector processor. As an example, CSP 320 may then interpret the request, and based on its firmware, may send a series of instructions to NFU 330. After a certain processing latency, the NFU may produce the result of the request, which may be combined with auxiliary data produced by CSP 320 in a lightweight output message processor (OMP) 340 and then sent off-chip. CSP firmware may provide instructions to NFU 330. Further details of the example instructions are discussed as part of the instruction set architecture (ISA). Run-time reloading of the firmware for CSP 320 may also be performed. Thus, in this example, the architecture is largely event driven. The input messages may arrive from many sources (including over the network). IMP may examine the head of the queue of the messages and it can dequeue any instructions that need to be performed and feed it through the system. Although FIG. 3 shows a certain number of components of the example node arranged in a certain manner, there could be more or fewer number of components arranged differently.

In one example, the NFU may be implemented as a matrix-vector processor designed to scale up to the majority of the FPGA's resources. In this example, the primary hardware acceleration goal of the NFU is to perform matrix-vector multiplications at high throughput and low latency with its matrix-vector unit (MVU) by applying thousands of multiply-adders. The NFU may receive matrices of coefficients (e.g., constants) and may be used for multiplying these coefficients with the dynamic input vector data. Thus, instead of storing the coefficients in a DRAM corresponding to a CPU/GPU, the coefficients may be pre-loaded at the service startup time into the on-chip memories (e.g., block random access memories (BRAMs) of FPGAs) corresponding to the NFU. In one example, the coefficients once loaded may never be re-loaded again unless the neural network model being used is modified or the service is restarted. In other words, as part of this example, the model may be partitioned and pinned in a distributed manner to the on-chip memories of multiple nodes (e.g., FPGAs) connected in a manner that they can transfer messages or packets to each other directly without relying upon assistance from CPU resources.

In one example, the MVU may be fully pipelined and may be capable of performing an $O(n^2)$ complexity matrix-vector multiplication in $O(n)$ time, at a performance of 400-1800 billion fixed point operations per second. While matrix-vector multiplications may represent the vast majority of the fixed-point operations required to evaluate an LSTM layer, the evaluation can also contain a variety of vector reductions, transcendentals, and the addition of bias vectors. The NFU may also implement pipelined multifunction units (MFUs) to handle these $O(n)$ complexity vector functions in $O(n)$ time. These MFUs may be organized into a chain architecture, with the MVU passing data to the first MFU, the first MFU passing data to the second MFU, and so on. In one example implementation of the NFU, 1 MVU and 5 MFUs may be used.

The chain architecture may allow the NFU to exploit massive pipeline parallelism between a single matrix-vector multiplication and several vector functions, based on the observation that vector functions could potentially dominate LSTM evaluation time in an architecture where vector and matrix-vector operations take approximately the same amount of time to compute. The NFU's memory subsystem may also be configured to support high throughput. As an example, the memory subsystem may support up to 1.8 TB/s of matrix value throughput along with support for loading 6 vectors and storing 6 vectors simultaneously.

Figure 4:
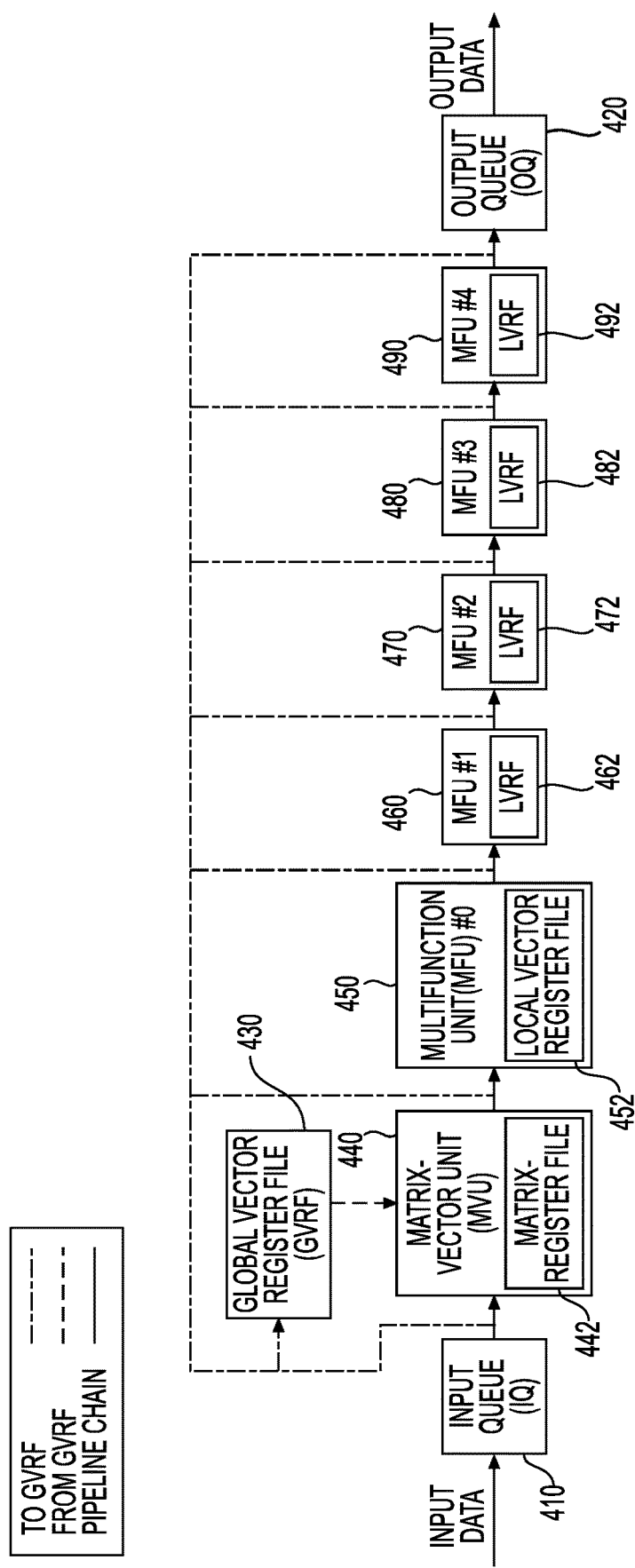
FIG. 4 is a block diagram of a neural functional unit in accordance with one example.

FIG. 4 shows an example implementation of an NFU 400. NFU 400 may include an INPUT QUEUE (IQ) 410 for receiving input data and OUTPUT QUEUE (OQ) 420 for outputting output data. Thus, NFU 400 can bring external vector and matrix data in through its INPUT QUEUE (IQ) 410 and emit vector data through its OUTPUT QUEUE (OQ) 420. NFU 400 may include a GLOBAL VECTOR REGISTER FILE (GVRF) 430 for providing a centralized location that may be used to store vector data. NFU 400 may include a MATRIX-VECTOR UNIT (MVU) 440 and five MULTIFUNTION UNITs (MFUs) (e.g., MFU #0 450, MFU #1 460, MFU #2 470, MFU #3 480, and MFU #4 490, as shown in FIG. 4). MVU 440 may include a MATRIX-REGISTER FILE 442 for storing matrices that may be pre-loaded at the time of starting a service that is being supported by the node. Each MFU may also include a LOCAL VECTOR REGISTER FILE (LVRF) 453 for storing local vector data for the corresponding MFU (e.g., LVRF 452, LVRF 462, LVRF 472, LVRF 482, and LVRF 492). The instructions may be executed by NFU 400 in order. A series of instructions may be configured such that the pipeline (including, e.g., the one MVU 440 and the five MFUs) executes the chain of instructions in parallel. As an example, input vector data may be multiplied using a matrix operation using MVU 440 and then it may be passed to the OUTPUT QUEUE 420 through the pipeline. The various data flow possibilities in NFU 400 are shown via the two dotted paths and one solid path in FIG. 4. Further details and examples of chaining of instructions are provided later.

The example NFU 400 may operate on vectors and matrices. A vector is a 1D set of scalar elements, and a matrix is a 2D set of scalar elements. The size of an element, vector, and matrix may be set using the parameter in Table 1 below.

TABLE 1

Element: Scalar value represented by ELEM_WIDTH bits
Vector: 1D set of elements with length HWVEC_ELEMS
Matrix: 2D set of elements with dimensions HWVEC_ELEMS × HWVEC_ELEMS
Lanes: Elements processed in parallel per cycle by most NFU submodules TABLE 1-continued Size of a vector in bits = HWVEC_ELEMS * ELEM_WIDTH
Size of a matrix in bits = HWVEC_ELEMS 2 * ELEM_WIDTH
Width of all NFU data busses in bits = LANES * ELEM_WIDTH
Cycles to transmit a vector over a data bus = HWVEC_ELEMS / LANES
Cycles to transmit a matrix over a data bus = HWVEC_ELEMS 2/LANES Certain parameters (e.g., as shown in Table 1) may be used to configure NFU 400 at the design time or later. In one example, four parameters may be used to configure NFU 400. The first parameter may be the data type of the matrix and vector elements, especially the width of a single element (ELEM_WIDTH). As an example, 8-bit fixed point data type, 16-bit fixed point data type, 27-bit fixed point data type, and 32-bit floating point data types may be the set of data types in one example. The width of each data bus in NFU 400 may be configured to be ELEM_WIDTH*LANES bits; each vector may use ELEM_WIDTH*HWVEC_ELEMS bits in memory; and each matrix may use ELEM_WIDTH*HWVEC_ELEMS*HWVEC_ELEMS bits in memory.

The second parameter may be the hardware vector size (HWVEC_ELEMS). In one example, all vectors stored within NFU 400 may have a fixed number of elements equal to HWVEC_ELEMS, and all vector instructions may accept HWVEC_ELEMS elements as input and/or produce HWVEC_ELEMS elements as output. Furthermore, all matrices may have a fixed number of elements equal to HWVEC_ELEMS.

Many applications may have their own algorithmic dimensions that may differ from the hardware vector size. When this is the case, the programmer (or the compiler) may map high-level operations to the hardware vector size using techniques such as matrix blocking. As an example, Table 2 below shows an application that has 500×500 matrix size and a 500-element vector size; however, the hardware vector size of NFU 400 is 250. The function shown in Table 2 may be used for addressing this difference.

TABLE 2

//algorithmic dimension: 500×500 matrix, 500-element vector
//hardware vector size = 250
Function matrix-vector_multiply_500×500:    input matrix_500×500 m, vector_500 iv; output vector_500 ov
    //Blocked matrix-vector multiplication (additions are pointwise vector additions)
    ov[0..249]= mv_mul(m[0..249][0..249], iv[0..249]) + m[0..249][250..499], iv[250..499])
    ov[250..499] = mv_mul(m[250..499][0..249], iv[0..249]) + mv_mul(m[250..499][250..499], iv[250..499])

The third parameter may be the number of vector lanes (LANES), which describes how many elements should be operated on in parallel within each MFU. As an example, the number of parallel operations within the matrix-vector unit (MVU) 440 may be defined as LANES*HWVEC_ELEMS assuming there are HWVEC_ELEMS tiles with LANES multiply-adders each. The tiles are described further as part of the description corresponding to an example matrix-vector unit (MVU) 440. Furthermore, every NFU data bus, including the top-level ports, may carry LANES vector elements per cycle for a total width of LANES*ELEM_WIDTH bits. In one example, LANES is an integer factor of HWVEC_ELEMS to avoid bit padding, since vectors are operated on in LANES-sized chunks and it takes HWVEC_ELEMS/LANES cycles to process a vector.

The fourth parameter may be the size of the matrix register file (NRF_SIZE), which stores a given number of HWVEC_ELEMS×HWVEC_ELEMS matrices in an on-chip memory corresponding to the NFU (e.g., fast on-chip BRAM (see description later). In one example, the memory resources need on a node (e.g., the number of BRAM resources on an FPGA) may be derived through the set of formulas below (note that ceil(x,y) rounds x up to the nearest multiple of y):

$$BRAM_{width} = ceil(LANES * DATA\_WIDTH, 40)$$

$$BRAM_{depth} = ceil\left(\frac{20480}{BRAM_{width}}, 512\right)$$

$$BRAMs = ceil\left(\frac{MRF\_SIZE * HWVEC\_SIZE * DATA\_WIDTH}{BRAM_{WIDTH} * BRAM_{DEPTH}}, 1\right) * HWVEC\_SIZE$$

$$\frac{M20Ks}{BRAM} = \frac{BRAM_{width}}{40} * \frac{BRAM_{dpeth}}{512}$$

$$M20Ks = \frac{M20Ks}{BRAM} * BRAMs$$

With respect to the memory subsystem, NFU 400 may distribute its internal storage across three main types of memories. First, a matrix register file may be used to store MRF_SIZE HWVEC_ELEMS×HWVECS_ELEMS matrices in a series of fast on-chip random access memories (e.g., BRAMs in an FPGA). These BRAMs may be distributed throughout the matrix vector unit and can each supply LANES matrix elements per cycle, for a total on-chip matrix throughput of HWVEC_ELEMS*LANES*ELEM_WIDTH bits/cycle. In this example, it may take O(HWVEC_ELEMS$^2$) cycles to store a matrix into the matrix register file; as such matrix stores may be performed in a preload step and then amortized against many matrix-vector multiplications.

Next, as shown in FIG. 4, global vector register file (GVRF) 430 may be used to act as a centralized location that programmers can use to store vector data. One example configuration for the GVRF can store 32 vectors, and can read LANES vector elements per cycle while also writing LANES vector elements per cycle. Furthermore, each multifunction unit in the NFU may have its own local vector register file (LVRF) that can also read and write LANES vector elements per cycle. Therefore, in an example NFU with 5 MFUs, the total vector memory bandwidth is 6*LANES reads and 6*LANES writes per cycle of 12 separate vectors. This vector memory architecture is configured to support chaining several vector functions together, one of which can read from the GVRF, each of which can read and write to one LVRF, and one of which can write back to the GVRF.

The NFU's matrix-vector unit (MVU) 440 may perform pipelined high-throughput low-latency matrix-vector multiplications. In one example, the MVU 440 uses LANES*HWVEC_ELEMS multipliers and adders to accomplish this goal, and its throughput can be measured as 2*LANES*HWVEC_ELEMS*fmax operations per second. In one example, unlike typical high-throughput matrix-vector multipliers, which rely on vector batching, the MVU 440 accepts one vector at a time into its pipeline.

Figure 5A:
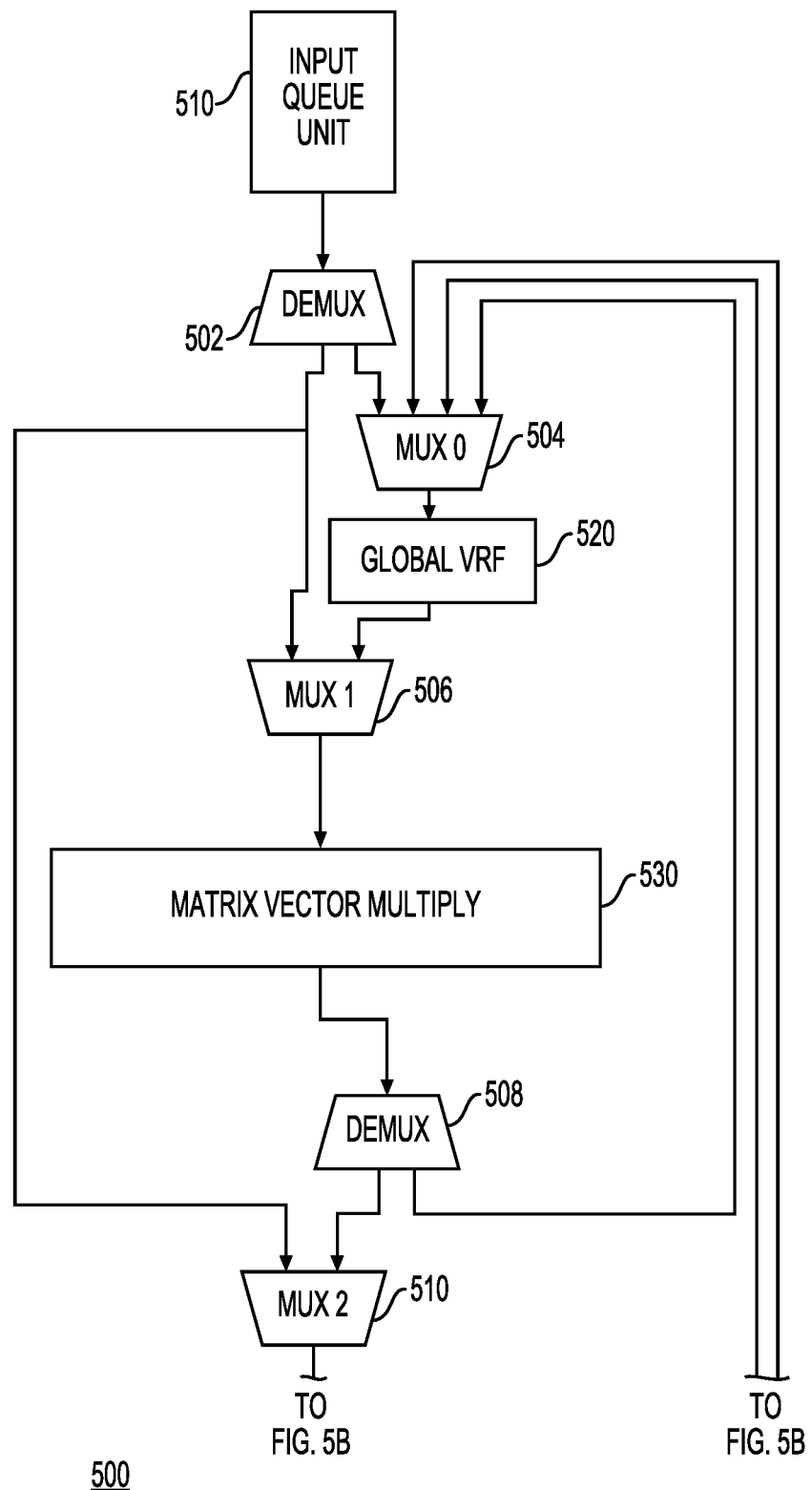
FIGS. 5A and 5B show a block diagram of a neural function unit in accordance with another example.
Figure 5B:
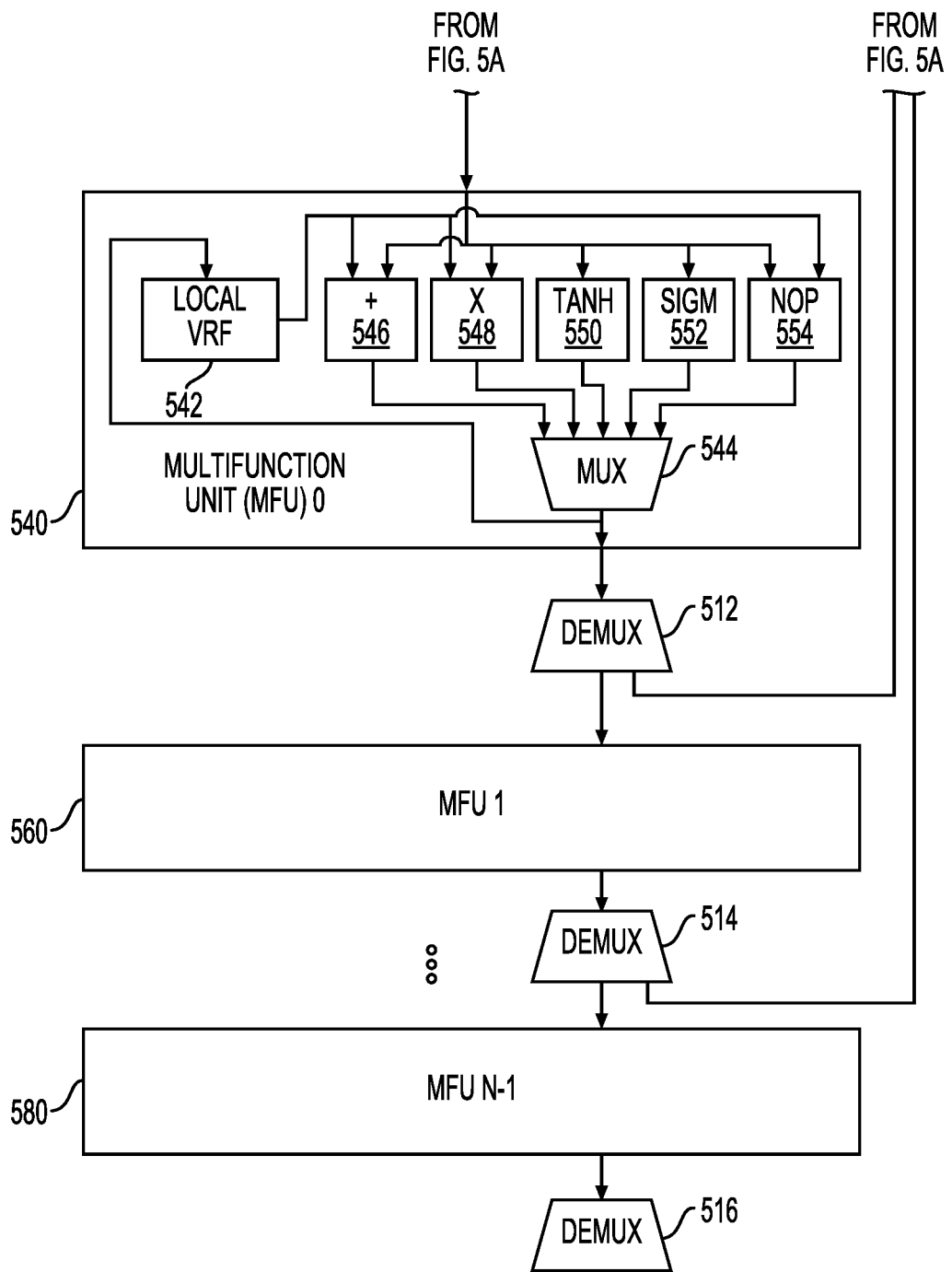

FIGS. 5A and 5B show a block diagram of a neural function unit (NFU) 500 in accordance with another example. NFU 500 may include an Input Queue Unit 510, a Global Vector Register File (VRF) 520, a Matrix Vector Multiply 530, and N multifunction units (MFUs). As an example, NFU 500 may include MFU 0 540, MFU 1 560, and MFU N−1 580. In this example, each of these components may be connected in a pipelined fashion. NFU 500 may further include an arrangement of multiplexers and de-multiplexers that may be used to control the routing of vectors, instructions, or other data through NFU 500. For example, NFU 500 may include multiplexers MUX 0 504, MUX 1 506, MUX 2 510 and MUX 544 and it may further include de-multiplexers DEMUX 502, DEMUX 508, DEMUX 512, DEMUX 514, and DEMUX 516. As an example, de-multiplexer DEMUX 502 may receive instructions or data from Input Queue Unit 510 and couple it to either multiplexer MUX 0 504 or multiplexer MUX 1 506. These alternative couplings may be achieved by providing a control signal to the de-multiplexer. The control signal may be generated by a decoder associated with NFU 500. Each MFU may include a local vector register file (LOCAL VRF) 542, an addition block (+) 546, a multiplication block (X) 548, a hyperbolic tangent function block (TANH) 550, a sigmoid block (SIGM) 552, and a no-operation (NOP) block 554, along with memory management functionality. Although FIG. 5 shows a certain number of components of NFU 500 arranged in a certain manner, there could be more or fewer number of components arranged differently.

Figure 6:
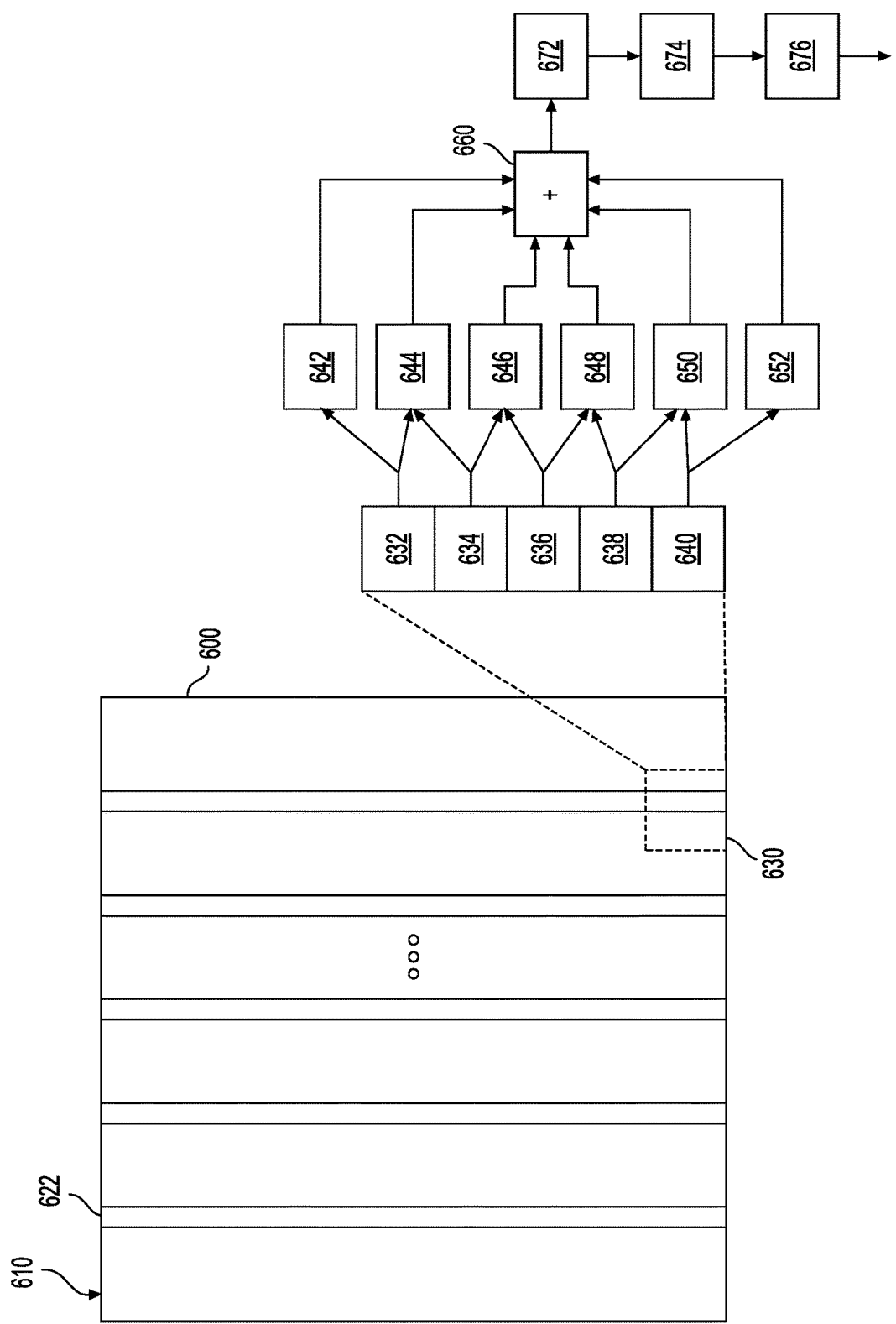
FIG. 6 shows a block diagram of a hardware node (e.g., an FPGA) for performing neural network processing in accordance with one example.

FIG. 6 shows a block diagram of a hardware node (e.g., an FPGA) 600 for performing neural network processing in accordance with one example. Hardware node 600 may include columns of memory elements (e.g., block RAMs) 610 and processing logic blocks (e.g., digital signal processors (DSPs)) 622. A small set of BRAMs and DSPs may be configured to create a processing tile, for example, processing tile 630. In the example in FIG. 6, each tile (e.g., processing tile 630) may include BRAMs 632, 634, 636, 638, and 640, which may be arranged as shown. Each processing tile 630 may further include processing logic blocks (e.g., digital signal processors (DSPs)) 642, 644, 646, 648, 650, and 652, which may be arranged as shown in FIG. 6. Processing logic blocks may be used to multiply an input vector with a row of weights. The output of processing logic blocks may be added using adder 660. Thus, in this example, each tile may perform a point-wise dot product operation. Although FIG. 6 shows a certain number of components of hardware node 600 arranged in a certain manner, there could be more or fewer number of components arranged differently.

Figure 7:
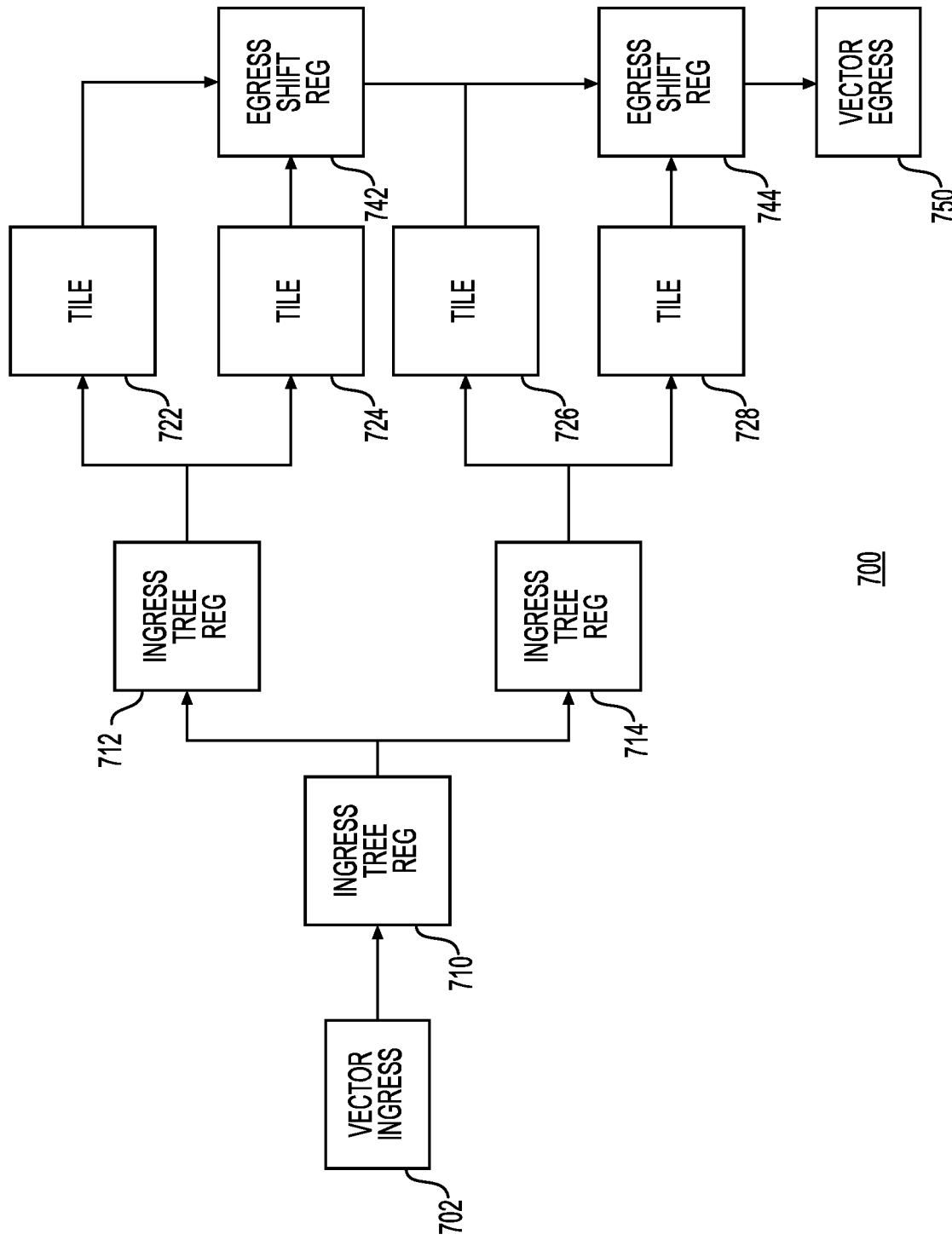
FIG. 7 shows a block diagram of an arrangement of tiles for performing neural network processing in accordance with one example.

FIG. 7 shows a block diagram of an arrangement 700 of tiles for performing neural network processing in accordance with one example. As shown in FIG. 7, in this example, these vectors are fed to an array of HWVEC_ELEMS processing elements (e.g., referred to as tiles in FIG. 7) through a tree broadcast. Thus, as an example, vectors, received via VECTOR INGRESS 702, may be stored in an INGRESS TREE register (REG) 710 shown in FIG. 7. Next, the vectors may fanout to two or more registers (e.g., INGRESS TREE REG 712 and INGRESS TREE REG 714). An additional parameter (FANOUT) may be used to describe the number of connections that fan out from each node in the ingress tree. The processing elements (e.g., tiles 722, 724, 726, and 728) may process the vectors and each tile may provide output to an EGRESS SHIFT register (REG) (e.g., EGRESS SHIFT REG 742 and EGRESS SHIFT REG 744). The output from the MVU may be shifted out through the VECTOR EGRESS block 750. The processing elements (e.g., tiles) may perform LANES multiplies and LANES additions each cycle.

The MVU may accept LANES input vector elements per cycle and, after a pipeline latency, emit LANES elements per cycle of the corresponding output vector. This latency for a single input vector may be defined as $\log_{FANOUT}$(HWVEC_ELEMS)+2*HWVEC_ELEMS/LANES because it takes $\log_{FANOUT}$(HWVEC_ELEMS) cycles for data to percolate through the ingress tree, HWVEC_ELEMS/LANES cycles to compute the output, and HWVEC_ELEMS/LANES cycles to emit the vector through the egress pipeline.

Figure 8:
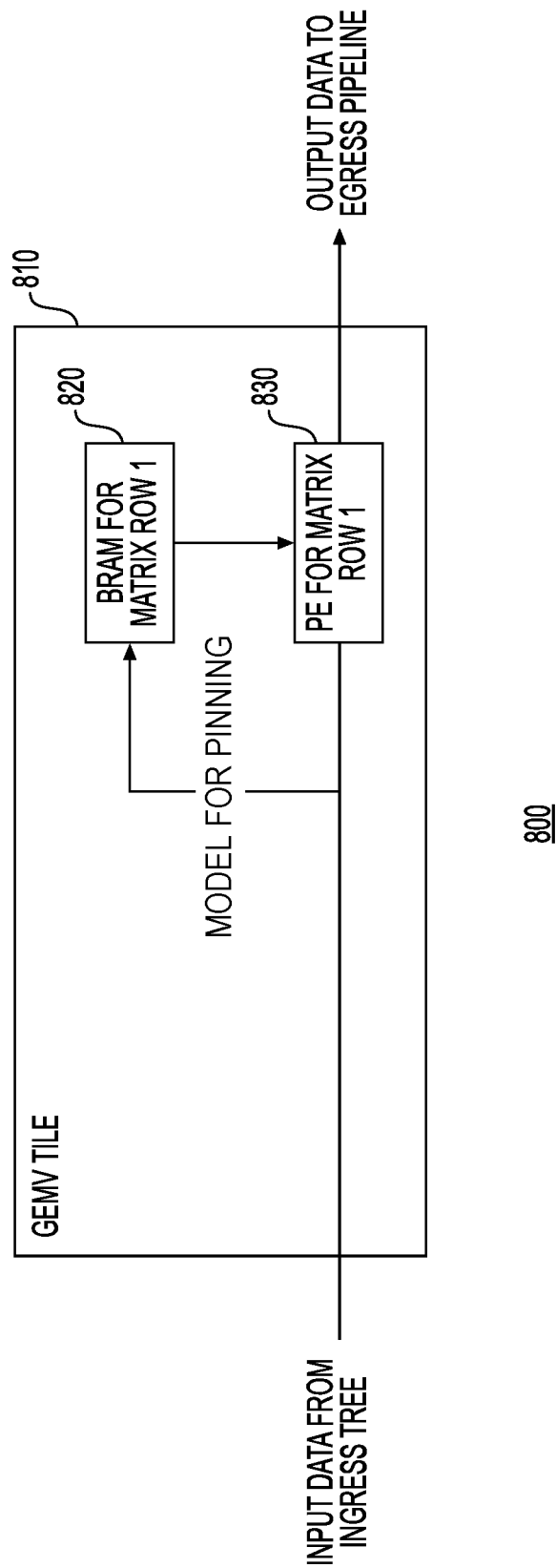
FIG. 8 shows a block diagram of a processing element in accordance with one example.

Each processing element (e.g., tile) may store one row of MRF_SIZE matrices and compute the dot product of the vector against a single row of a selected matrix using its processing element. FIG. 8 shows a block diagram of a processing element 800 in accordance with one example. In this example, the processing element may be implemented as a general matrix multiply for vectors (GEMV) tile 810. Each processing element 800 may receive input data from an ingress tree (e.g., as shown in FIG. 5) and output data to an egress pipeline (e.g., as shown in FIG. 7). Each processing element may include a block RAM (e.g., BRAM for MATRIX ROW 1 820) for storing vector data. In this example, each processing element (e.g., the GEMV tile) may include a BRAM that may store row 1 of a matrix and process the vector data in that row. In one example, a processing element may calculate a dot product between the vector data and any input data (e.g., via received via the path INPUT DATA FROM AN INGRESS TREE) using a processing block (e.g., PE for MATRIX ROW 1 830). The output data may be provided for further processing via the path OUTPUT DATA TO EGRESS PIPELINE. Although FIG. 8 shows a certain number of components of GEMV tile 810 arranged in a certain manner, there could be more or fewer number of components arranged differently.

Figure 9:
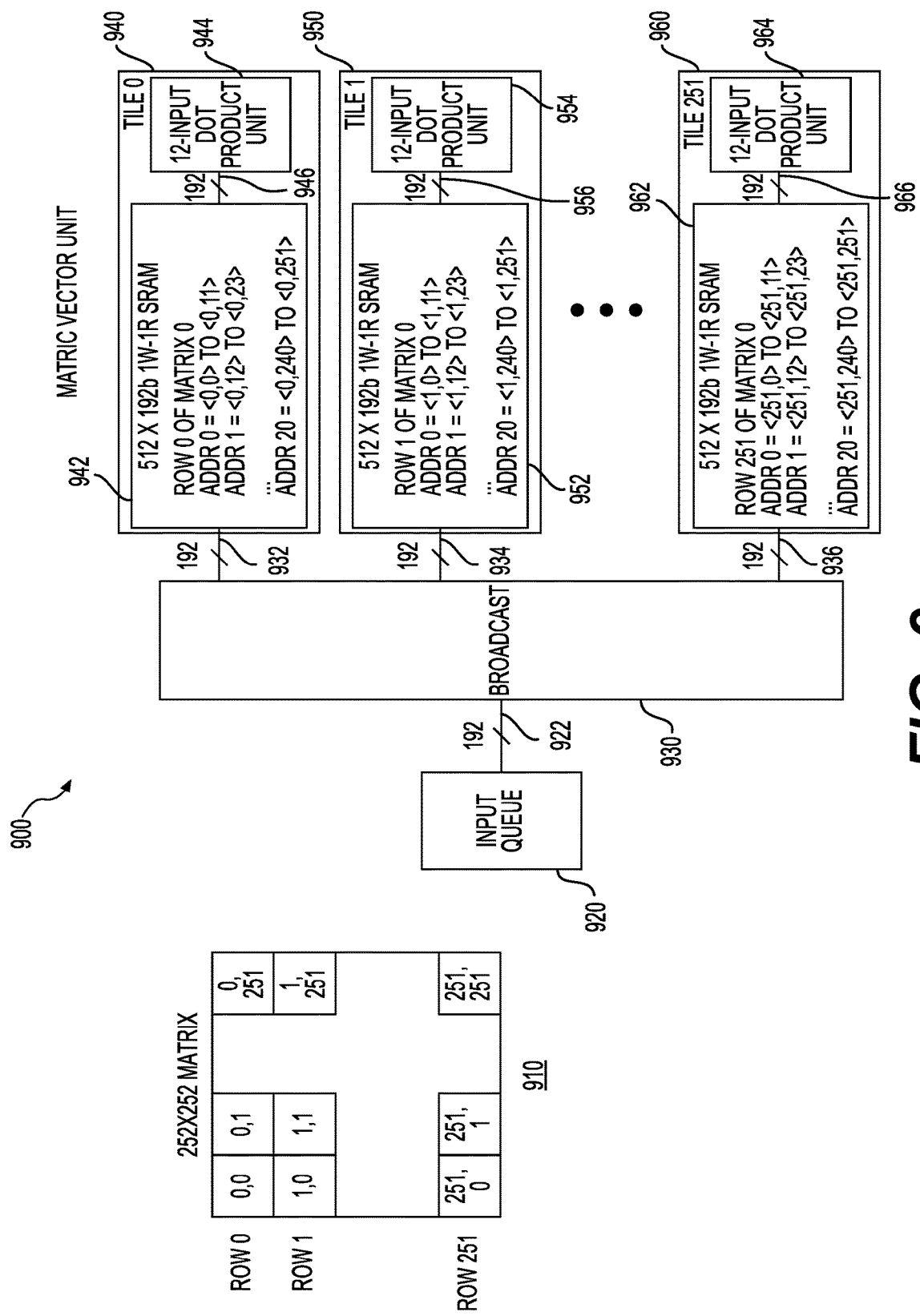
FIG. 9 shows an example implementation of a node including a matrix of tiles.

FIG. 9 shows an example implementation of a node 900 in including a matrix of tiles. In this example implementation, a 252×252 matrix 910 of data is processed using a node 900 that has 252 tiles. Example node 900 may receive data via Input Queue 920, which may be coupled to a BROADCAST block 930 using a bus 922. In this example, the bus width of bus 922 may be 192 bits. BROADCAST block 930 may be coupled via individual buses to SRAM blocks to allow the quick loading of the pre-trained neural network model into node 900. FIG. 9, as an example, shows TILE 0 940, TILE 1 950, and TILE 251 960. TILE 0 940 may be coupled via a 192-bit bus 932 to BROADCAST block 930. TILE 1 950 may be coupled via a 192-bit bus 934 to BROADCAST block 930. TILE 251 960 may be coupled via a 192-bit bus 936 to BROADCAST block 930. Each tile may include a corresponding SRAM and a dot product unit. As an example, TILE 0 940 may include SRAM 942 and dot product unit 944, which may be coupled to each other using a 192-bit bus 946. TILE 1 950 may include SRAM 952 and dot product unit 954, which may be coupled to each other using a 192-bit bus 956. TILE 251 960 may include SRAM 962 and dot product unit 964, which may be coupled to each other using a 192-bit bus 966. Each SRAM may store one row of a matrix of weights, which may be stored based on the addressing scheme shown in FIG. 9. Each dot product unit may be implemented as a 12-INPUT dot product unit. At service startup, the pre-trained neural network model weights may be streamed into the on-chip memories of an FPGA (e.g., the SRAMs in FIG. 9) and pinned into specific arrangements allowing the compute units to generate output at a very high throughput. In one example, each row of the matrix may represent a neuron and each column entry in the row may represent the synaptic weight that is attached to that neuron. The coefficients stored in a matrix form (representing the neuron, for example) may be preloaded into the SRAMs or other memory associated with the hardware node. In an instance where the neurons do not fit on a single hardware node (e.g., an FPGA), a portion of the neurons may be loaded into a second hardware node and so on. In one example, the neural weight matrices may be distributed using graph partitioning techniques. Such that a graph representing the neural weight matrices may be split into subgraphs, which could be then pinned into the memories of the different hardware nodes, which could communicate with each other using a lightweight transport protocol or other types of protocols. Hardware nodes may communicate directly with each other, for example, using the architecture and systems described via FIGS. 1 and 2.

BROADCAST block 930 may include the ingress tree as discussed earlier with respect to FIG. 5. This example shows an architecture built using an FPGA that operates on fixed-size matrices and vectors. In this example, the native size that is supported is 252 by 252 square matrices. In other parametrized instances of these designs other shapes and sizes of matrices may be used. In this example, there are 24 square matrices that can be stored into the on-chip memories (e.g., the SRAMs). Thus, in this example there is an array of 252 tiles, and each tile is a compute unit. Each SRAM can receive 192 bits from the broadcast block and output 192 bits to the 12-input dot product unit per clock cycle. That translates into feeding 12 elements per cycle at 16 bits per element. As an example, the row of the SRAM corresponding to address 0 (ADDR 0) is configured to store elements 0-0 through 0-11, which are the first 12 elements. At ADDR 1, another 12 elements are stored and so on. This example shows one packing strategy to feed multiple elements of a row per clock cycle. In this example, the SRAM uses only 21 rows, address 0 through address 20, and that's enough to store the entire square matrix. In this example, up to twenty-four 252 by 252 square matrices may be packed into the on-chip memory corresponding to node 900. Depending on the numeric precision of the weights, fewer or more matrices could be packed. As an example, an 8-bit mode may be used to pack up to 48 matrices of the same size as in the 16-bit mode. Indeed, other permutations can also be supported.

The 12-input dot product unit performs the compute, and thus, in this example, node 900 includes a vector multiply-addition tree. As an example, to perform a dot product operation, an element pair-wise multiply between each element of that row against each element of the vector may be performed and then summed up into one accumulated variable. In the example shown in FIG. 9, each of the tiles is responsible for computing one row of the matrix. On every clock cycle, 12 elements out of that matrix may be processed at a time. This example corresponds to 16-bit integer arithmetic (e.g., each weight is represented by 16 bits) and hence each SRAM entry is 512×192 bits. Other bit sizes may be used, including, for example, 1 bit, 2 bits, 4 bits, or 8 bits to represent the weights corresponding to the neural network mode.

Figure 10:
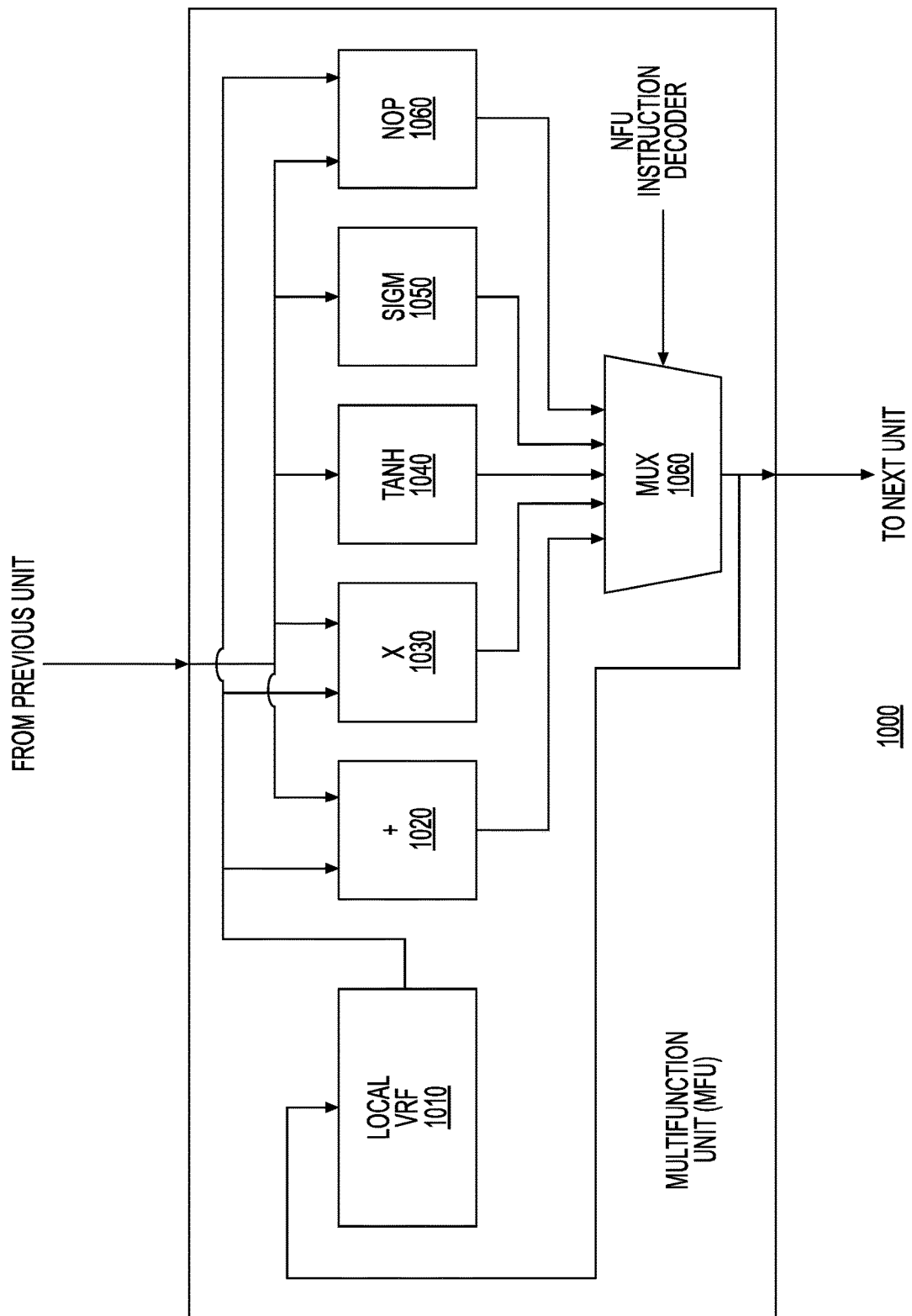
FIG. 10 shows a block diagram of multifunction unit in accordance with one example.

FIG. 10 shows a block diagram of multifunction unit (MFU) 1000, in accordance with one example, corresponding to an NFU described earlier, for example, with respect to FIG. 4. With respect to the NFU's multifunction units (MFUs), they may perform several vector functions based on local and/or external data. An example MFU implementation may support pointwise addition, multiplication, sigmoid, and hyperbolic tangent functions, along with pass-through and memory management functionality. In one example, each MFU may be configured in a way that every operator (e.g., a hardware block for performing an operation) needed by every instruction type that an MFU can handle is provided in every MFU and is replicated along a chained path of multiple MFUs (e.g., as shown in FIG. 4). This way chained instructions (explained later) may be flexibly formed without having to prescribe or provide an instruction's position in a chain. The sigmoid and hyperbolic tangent may be implemented using lookup tables. For a selected function, in one example, a single MFU can perform a certain number of operations (e.g., operations specified by the LANES parameter described earlier) per cycle while adding 1 to 2 cycles of latency for adds/multiplies and sigmoids/tangents, respectively. In this example, MFU 1000 may include hardware blocks configured to perform different operations. Each hardware block may perform operations on values or operands received from several sources, including, for example the previous MFU, the MVU, or the GVRF. The intermediate values may be stored in a local vector register file (LVRF) 1010. As an example, one hardware block 1020 may perform an addition operation. Another hardware block 1030 may perform a multiply operation. Another block 1040 may perform a tangent (e.g., TANH) operation. Another block 1050 may perform a sigmoid (SIGM) operation. Yet another block 1060 may perform no operation (NOP). The outputs of the various hardware blocks may be supplied to multiplexer 1060. Based on a control signal or control signals from the various queue controllers or other control logic, the multiplexer (MUX) may provide an output, which may be coupled to the next MFU in the pipeline or to the output queue. In one example, the control signal may be a signal received from an instruction decoder corresponding to the neural functional unit (NFU). The output of the MUX may also be coupled to LVRF 1010 for storing intermediate values corresponding to the various operations performed by the example MFU. In one example, a control processor that may be adjacent to the pipeline may have a queue of instructions and it can write the instructions dynamically into the relevant queues for the various components of the NFU. As the instructions are executed they may fan out into independent control queues and that may determine which part of the NFU gets activated. Each of the components of the NFU may access the head of the control queue and perform an operation, for example, an add, multiply, tangent, sigmoid, or NOP accordingly. The control queue may not dequeue until all vectors have passed through and then the control queue may pass onto the next component. Although FIG. 10 shows a certain number of components of MFU 1000 arranged in a certain manner, there could be more or fewer number of components arranged differently. As an example, MFU 1000 may include additional hardware blocks to perform other operations, such as a softmax operation, a Rectified Linear Unit (ReLU) operation, an activation block operation etc.

In terms of one example instruction set architecture (ISA) related to the nodes including the NFUs, the instructions may always execute in program order. In addition, all instructions may act on vectors and/or matrices of the native size HWVEC_ELEMS. The ISA may be used to expose both the distributed memory system and the massive pipeline parallelism available in the NFU pipeline. In one example, this parallelism may be exploited by explicitly identifying two or more instructions as members of a chain. An example chain might use the instructions for matrix-vector multiply, vector-vector add, and vector sigmoid to configure a pipeline that spans the MVU and two MFUs to perform all three instructions in parallel. In one example, instructions may qualify as a chain when: a series of dependent instructions up to one input and up to one output require global memory, all other arguments rely only on the intermediate values and the contents of local memories, and each functional unit the NFU is used in pipeline order and at most once.

In one example, the programs may be compiled or structured to attempt to chain as many instructions together as possible to maximize performance. A pair of instructions can be chained together by asserting a forward flag in the first instruction's destination argument and by asserting a receive flag in place of a source address argument in the second instruction. The chain continues until an instruction does not assert forward, or all functional units in the NFU have already been used in the chain. Thus, in this example, it is illegal to assert forward in one instruction and then not assert receive in the following instruction (and vice versa).

Instructions may be mapped to the NFU's functional units by their resource requirements. For example, matrix-vector multiply can only take place in the matrix-vector unit (MVU), whereas vector-vector add can only take place in a multifunction unit (MFU). In this example, chains of instructions must use the NFU's functional units in the left-to-right pipeline order shown in FIG. 4 (Input Queue (IQ), MVU, then each MFU, and then output queue (OQ).

However, in one example, chains can be started from the IQ, MVU, or the first MFU. Finally, in this example, the first instruction in a chain that needs an MFU will be mapped to the MFU 0, the next will use MFU 1, etc. In this example, this is important because the local memory used by an MFU instruction is implicitly set by the depth of that instruction in the chain, both for storing and loading.

Most instructions may take the same general set of arguments: a source, a destination, and optionally a second source. There may also be a few memory management instructions that may specifically identify a target MFU, but in general the MFU that will execute an instruction is inferred from the instruction's position in the chain. Each source and destination argument may use one of the strong types from Table 3 below. For example, a DST argument implies that the output of an instruction can be forwarded, stored globally, or stored locally, whereas a GDST argument can only be stored globally. In this example, only instructions that take a GSRC can be appended to a chain, and only instructions that supply a DST can pass data down a chain.

In general, most instructions can be used in a chain or in standalone mode (global source and global destination). However, in this example, the memory management instructions (those starting with VRF_) cannot be used within chains, and some instructions (V_PASS, V_STORE) can only be used within chains.

TABLE 3

| Instruction | Target Functional Unit | Chainable | Arguments | Description |
|---|---|---|---|---|
| IQ_V | Input Queue | x | DST | Move a vector into the NFU through the IQ into DST (no local storage option) |
| IQ_M | Input Queue | | MDST | Move a matrix into the NFU through the IQ into the MRF at MDST |
| OQ_V | Output Queue | x | GSRC | Move a vector from GSRC out of the NFU through the OQ |
| MV_MUL | Matrix-Vector Unit | x | GSRC MSRC DST | Multiply a matrix at MSRC by a vector from GSRC and deliver it to DST. Local storage takes place in the accumulation registers and is mutually exclusive with forwarding. |
| V_SIGM | Multifunction Unit | x | GSRC DST | Apply a pointwise sigmoid to the vector at GSRC and deliver to DST |
| V_TANH | Multifunction Unit | x | GSRC DST | Apply a pointwise hyperbolic tangent to the vector at GSRC and deliver to DST |
| V_PASS | Multifunction Unit or Matrix-Vector Unit | x | | Pass a forwarded vector through the current functional unit in the chain (MVU or any MFU) |
| V_LSTORE | Multifunction Unit | x | LDST | Store a received vector in the current functional unit's local memory (MFUs only) |
| VV_ADD | Multifunction Unit | x | GSRC LSRC DST | Add a vector from GSRC to the vector at LSRC and send it to DST |
| VV_MUL | Multifunction Unit | x | GSRC LSRC DST | Multiply a vector from GSRC to the vector at LSRC and send it to DST |
| VRF_L_G_COPY | Multifunction Unit | | MFU LSRC GDST | Copy a vector from LSRC in the LVRF within a particular MFU to GDST within the GVRF |

TABLE 3-continued

| Instruction | Target Functional Unit | Chainable | Arguments | Description |
|---|---|---|---|---|
| VRF_G_L_COPY | Multifunction Unit | | MFU GSRC LDST | Copy a vector from the GVRF at GSRC to a particular MFU's LVRF at LDST |
| VRF_G_G_COPY | Multifunction Unit | | GSRC GDST | Copy a vector from GSRC to GDST within the GVRF |
| VRF_FILLZ | N/A | | GDST | Fill an address in the GVRF with zeroes at GDST |

A node service may communicate with each node including the control/scalar processor (CSP) and the NFU using an application programming interface (API). The API may be used to send instructions to the NFU and to accept/formulate requests/responses to the network. A node service may receive a request from the network, launch a subroutine with arguments from the request, and then send a response back over the network. In this example, a request may include a node header, which is interpreted by the CSP, along with a payload, which is forwarded to the NFU. Likewise, outgoing responses may have a node header and (optional) payload.

The programming model for the nodes may allow for subroutines to take up to the 30 runtime arguments. These arguments may be passed into the subroutine through the node header as "auxiliary data." In one example, Aux[0] may be reserved for selecting a subroutine. In one example, one common use for a runtime argument is to set the number of iterations for a given LSTM evaluation. Each subroutine may be a series of API calls that perform matrix and vector operations. Each of these API calls may correspond to an NFU instruction, and when the CSP encounters one of these API calls it may send that instruction to the NFU. In one example, all instructions may act on vectors of dimension HWVEC_ELEMS and matrices of dimensions HWVEC_ELEMS×HWVECV_ELEMS. A set of helper functions (shown below in Table 4) may be used to set the appropriate bit fields in arguments:

TABLE 4

| | |
|---|---|
| GDST(addr) | Sets the address field of a GDST or DST with the value in addr, and sets the store and store_global |
| LDST(addr) | Sets the address field of a LDST or DST with the value in addr, and sets the store flag for a DST |
| FGDST(addr) | Sets the forward, store, and store_global flags and sets the address field of a DST with the value in addr |
| FLDST(addr) | Sets the forward and store flags and sets the address field of a DST with the value in addr |
| GSRC(addr) | Sets the address field of a GSRC with the value in addr |
| LSRC(addr) | Sets the address field of a LSRC with the value in addr |

Additionally, three helper constants may be used as shown in Table 5 below:

TABLE 5

| | |
|---|---|
| NEXT | Sets only the forward flag of a DST |
| PREV | Sets only the receive flag of a GSRC |
| ACC | Sets only the store flag of a DST (for use only with the mv_mul API) |

One of the subroutines may be a loopback that takes a vector into the NFU from the input queue and stores it in global memory, then reads it from global memory and sends it out of the NFU through the output queue. An example loopback subroutine is shown in Table 6 below:

TABLE 6

| | Subroutine 1: Loopback |
|---|---|
| 1. | iq_v(bs, GDST(0), NO_MFU) |
| 2. | oq_v(bs, GSRC(0)) |

The loopback example can be expanded by performing an elementwise sigmoid on the input vector before sending it back out. One way to accomplish this is to call the input vector, sigmoid, and output vector APIs in standalone mode as shown in Table 7 below:

TABLE 7

| | Subroutine 2: Sigmoid of a vector |
|---|---|
| 1. | iq_v(bs, GDST(0), NO_MFU) |
| 2. | v_sigm(bs, GSRC(0), GDST(1)) |
| 3. | oq_v(bs, GSRC(1)) |

The example in Table 7 above does not use any instruction chaining, however it is possible to achieve higher performance by chaining all three operations together. To accomplish chaining, the flow of the data between the input queue, the MFU that executes the sigmoid, and the output queue is analyzed. With respect to the example NFU in FIG. 4, the chain needs to pass data through the MVU and the other 4 MFUs in the pipeline. Chaining uses fewer cycles because, as an example, it avoids making multiple round trips through the global memory, which can be an expensive operation in terms of the consumption of time. Table 8 below shows one example of a subroutine that has been optimized using chaining.

TABLE 8

| | Subroutine 3: Optimized sigmoid of a vector (intermediate values discarded) |
|---|---|
| 1. | iq_v(bs, NEXT, NO_MFU) |
| 2. | v_pass(bs, PREV) //pass through the MVU |
| 3. | v_sigm(bs, PREV, NEXT) //takes place in MFU 0 |
| 4. | v_pass(bs, PREV) //pass through MFU 1 |
| 5. | v_pass(bs, PREV) //pass through MFU 2 |
| 6. | v_pass(bs, PREV) //pass through MFU 3 |
| 7. | v_pass(bs, PREV) //pass through MFU 4 |
| 8. | oq_v(bs, PREV) |

The second approach uses more instructions, but also executes in significantly fewer cycles. Note that the second approach discards both the input vector and output vector after their initial use. If these values needed to be stored for later use then Subroutine 4 in Table 9 may be used.

TABLE 9

Subroutine 4: Optimized sigmoid of a vector (intermediate values stored)

1. iq_v(bs, FGDST(0), NO_MFU) //Pass to next and store in global memory
2. v_pass(bs, PREV) //pass through the MVU
3. v_sigm(bs, PREV, FLDST(0)) //takes place in MFU 0; pass to next and store in MFU 0's local memory
4. v_pass(bs, PREV) //pass through MFU 1
5. v_pass(bs, PREV) //pass through MFU 2
6. v_pass(bs, PREV) //pass through MFU 3
7. v_pass(bs, PREV) //pass through MFU 4
8. oq_v(bs, PREV)

The process for adding two vectors builds on the process for taking the sigmoid of a vector. The main difference is that the add requires a second input vector which, in one example, must always be sourced from the local memory of the MFU executing the add. In this example, if the second operand is not already present in the local memory then another instruction (e.g. a vrf_g_l_copy) is required to place it there. Assuming Subroutine 4 of Table 9 has executed and has stored a vector in global address 0 and the sigmoid of that vector in MFU 0's local address is 0, the following API call would add those two vectors together and store the result back in global memory.

TABLE 10

Subroutine 5: Adding two vectors 1. vv_add(bs, GSRC(0), LSRC(0), GDST(1))

As discussed earlier, any matrices used by a program using the processing components are preloaded at the startup time, because in this example it takes O(HWVEC_ELEMS$^2$) cycles to store a matrix from outside of the node, whereas every other operation takes O(HWVEC_ELEMS) cycles. It may also be desirable to preload a set of bias vectors that remain constant throughout execution. The following example subroutine stores two weights matrices in matrix memory (the matrix register file within the MVU). It then loads two bias vectors, one into MFU 1's local memory and one into MFU 2.

TABLE 11

Subroutine 6: Matrix and vector initialization 1. iq_m(bs, 0)
2. iq_m(bs, 1)
3. iq_v(bs, GDST(0), NO_MFU)
4. vrf_g_l_copy(bs, MFU1, GSRC(0), LDST(0))
5. iq_v(bs, GDST(0))
6. vrf_g_l_copy(bs, MFU2, GSRC(0), LDST(0))

The performance of vector loading may be improved by using the example subroutine with instruction chaining, as shown in Table 12 below.

TABLE 12

Subroutine 7: Matrix and vector initialization with chaining 1. iq_m(bs, 0)
2. iq_m(bs, 1)

TABLE 12-continued

Subroutine 7: Matrix and vector initialization with chaining 3. iq_v(bs, NEXT, NO_MFU) //Starts a chain
4. v_pass(bs, PREV) //Pass through the MVU
5. v_pass(bs, PREV) //Pass through MFU 0
6. v_lstore(bs, LDST(0)) //Store in MFU 1, ending the chain
7. iq_v(bs, NEXT, NO_MFU) //Starts a chain
8. v_pass(bs, PREV) //Pass through the MVU
9. v_pass(bs, PREV) //Pass through the MFU 0
10. v_pass(bs, PREV) //Pass through the MFU 1
11. v_lstore(bs, LDST(0)) //Store in MFU 2, ending the chain Once the matrices and vectors have been preloaded, Table 13 is an example illustrating an example subroutine that performs: v_out=(m[0]*v_in[2]+m[1]*v_in[3]+v_in[0])*v_in[1]. Thus, in this example, it is assumed that Subroutine 6 was already called to preload m[0], m[1], v_in[0], and v_in[1].

TABLE 13

Subroutine 8: Matrix-vector chain 1. iq_v(bs, NEXT, NO_MFU) //start a chain
2. mv_mul(bs, PREV, m[0], NEXT) //perform m[0]* v_in[2] and store the result in global memory
3. v_lstore(bs, LDST(0)) //store the result in MFU 0
4. iq_v(bs, NEXT, NO_MFU)) //start a chain
5. mv_mul(bs, PREV, m[1], NEXT) //perform m[1]* v_in[3]
6. vv_add(bs, PREV, LSRC(0), NEXT) //sum the two MVU results in MFU 0
7. vv_add(bs, PREV, LSRC(0), NEXT) //perform the addition of v_in[1] in MFU 1
8. vv_add(bs, PREV, LSRC(0), NEXT) //perform the multiplication of v_in[1] in MFU 2
9. v_pass(bs, PREV) //pass through MFU 3
10. v_pass(bs, PREV) //pass through MFU 4
11. v_pass(bs, PREV) //pass through MFU 5
12. oq_v(bs, PREV)

In one example, an MVU feature can be used to optimize the resource utilization of Subroutine 8 of Table 13, which uses MFU 0 to sum the two mv_mul( ) results. The MVU allows the result of a matrix-vector multiplication to be kept in its accumulation registers rather than outputting the vector. If that feature is enabled for an mv_mul (by asserting the store flag), the next mv_mul's result will be summed against the result of the first. In this example, to make this optimization work, as shown in Table 14 below, Subroutine 6 may be adjusted to store v_in[0] and v_in[1] in MFU 0 and MFU 1 instead. Table 15 further below shows an optimized matrix-vector subroutine that uses chaining.

TABLE 14

Subroutine 9: Adjusted matrix and vector initialization 1. iq_m(bs, 0)
2. iq_m(bs, 1)
3. iq_v(bs, GDST(0), NO_MFU)
4. vrf_g_l_copy(bs, MFU0, GSRC(0), LDST(0))
5. iq_v(bs, GDST(0), NO_MFU)
6. vrf_g_l_copy(bs, MFU1, GSRC(0), LDST(0))

TABLE 15

Subroutine 10: Optimized matrix-vector chain 1. iq_v(bs, NEXT, NO_MFU) //start a chain
2. mv_mul(bs, PREV, m[0], ACC) //perform m[0]* v_in[2] and hold the result in accumulation registers
3. iq_v(bs, NEXT, NO_MFU) //start a chain
4. mv_mul(bs, PREV, m[1], NEXT) //perform m[1]* v_in[3] + the result of the first mv_mul
5. vv_add(bs, PREV, LSRC(0), NEXT) //perform the addition of v_in[0] in MFU 0
6. vv_mul(bs, PREV, LSRC(0), NEXT) //perform the multiplication of v_in[1] in MFU 1
7. v_pass(bs, PREV) //pass through MFU 2
8. v_pass(bs, PREV) //pass through MFU 3
9. v_pass(bs, PREV) //pass through MFU 4
10. oq_v(bs, PREV)

Additional improvements may be made to the subroutines by using coding and compiler techniques that avoid hard-coded addresses and instead expose the intent of the address with well-named constants. Furthermore, typedefs may be provided for identifying vector, matrix, and MFU addresses with VectorNum, Matrix, and MFU, respectively. To ensure consistency in coding, the style shown below in Table 16 may be used:

TABLE 16

A vector stored in global memory has a descriptive name, e.g. b_0 for bias vector zero
A vector stored in local memory has the MFU name attached as a prefix, e.g. mfu0_b_0 for if we are storing b_0 in MFU 0
A generic matrix should use the letter m as a prefix, e.g. m0 is the first matrix loaded
MFUs should be named corresponding to their index, e.g. MFU 0 is at mfu0

In this example, certain addresses shown below in Table 17 must be set to physical addresses in the node's distributed memory:

TABLE 17

| 1.  | const VectorNum b_0 = 0;         |
| --- | -------------------------------- |
| 2.  | const VectorNum b_1 = 1;         |
| 3.  | const VectorNum mfu0_b_0 = 0;    |
| 4.  | const VectorNum mfu0_b_1 = 1;    |
| 5.  | const Matrix m0 = 0;             |
| 6.  | const Matrix m1 = 1;             |
| 7.  | const MFU mfu0 = 0;              |
| 8.  | const MFU mfu1 = 1;              |
| 9.  | const MFU mfu2 = 2;              |
| 10. | const MFU mfu3 = 3;              |
| 11. | const MFU mfu4 = 4;              |

As an example, LSTM evaluation programs for the nodes with the CSP and the NFU may include a preload step followed by several iterations of an evaluation until the output is created. Thus, in this example, first, a preload step stores the weights matrices and bias vectors needed for evaluation across the NFU's distributed memory. Next, for each iteration of evaluation, an input vector arrives and is processed through increasingly long chains of instructions until the output is created.

Figure 11:
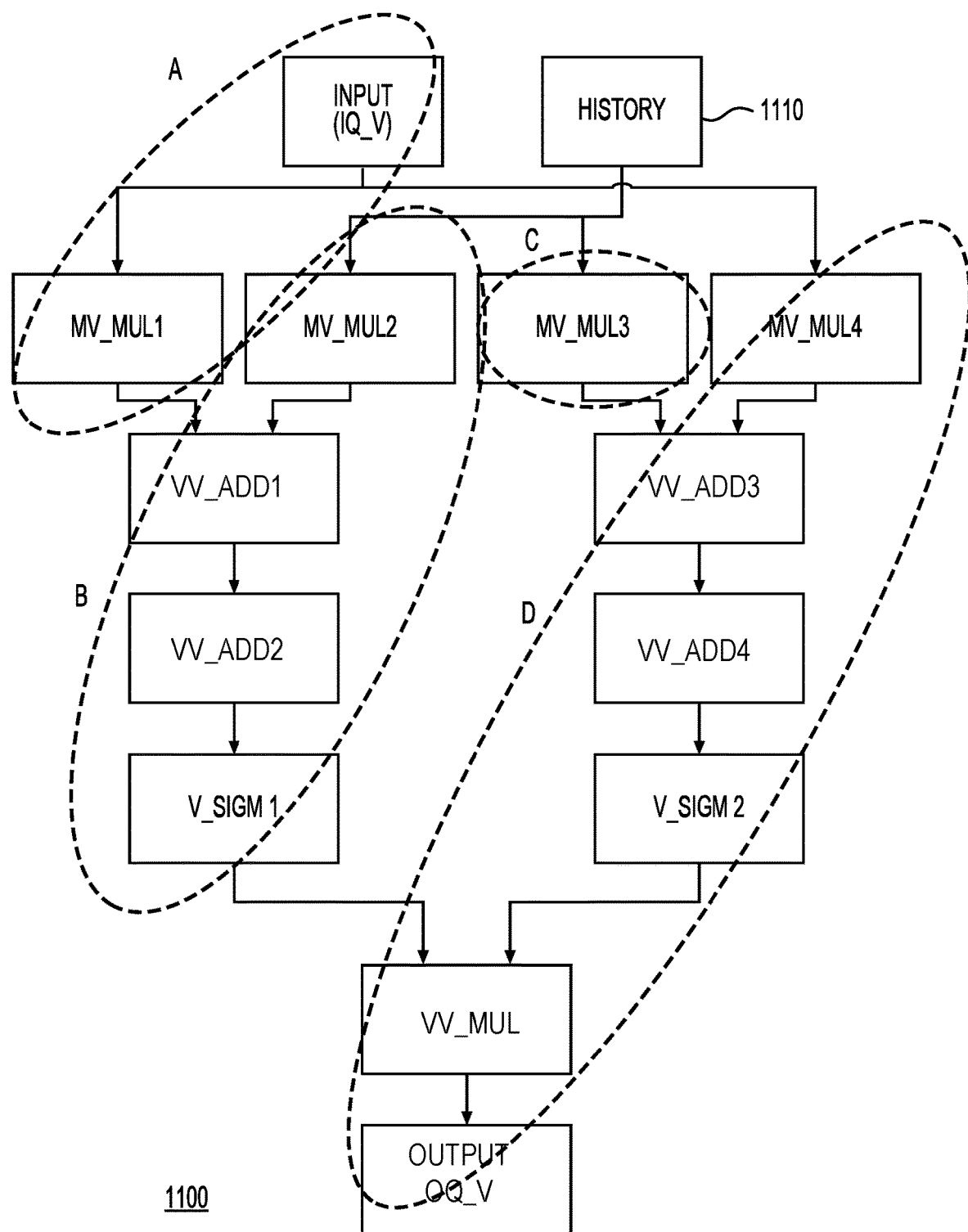
FIG. 11 shows a dataflow graph for a neural network evaluation in accordance with one example.

FIG. 11 shows a dataflow graph 1100 for a neural network evaluation in accordance with one example. At a high level, in this example, one input vector is loaded (IQ_V) and is multiplied against two weights matrices (MV_MULs 1 and 4). A history vector is also multiplied against two other weights matrices (MV_MULs 2 and 3). Next, the results of one pair of input/history results are summed together, as is the other pair of input/history results (VV_ADDs 1 and 3). After that, each sum vector is added against a bias vector (VV_ADDs 2 and 4) and then applied against a sigmoid (V_SIGMs 1 and 2). The sigmoid results are then multiplied together and the result is the final output (VV_MUL and OQ_V).

A dependence analysis of this dataflow graph shows the opportunity for 4 chains of instructions. The dependence analysis may be performed using a compiler or a similar tool. For example, Chain A (shown via dotted lines in FIG. 11) takes its vector input from the input queue, stores that vector in the GVRF, and then uses it to perform MV_MUL 1 against a matrix in local memory. The result of MV_MUL is also stored in local memory. In this example, Chain B (shown via dotted lines in FIG. 11) can follow Chain A immediately through the pipeline because it takes one input (the history vector) from global memory, takes a matrix from local memory for MV_MUL 2, adds against a preloaded bias vector in local memory for W_ADD 1 and the locally stored result of MV_MUL 1 for W_ADD 2, and performs V_SIGM 1 on the result of W_ADD 2. The result of V_SIGM is stored in local memory as well, to facilitate Chain D (shown via dotted lines in FIG. 11).

The example data flow graph from FIG. 11 can be implemented in an optimized fashion in the following example subroutines including Subroutine 11 for the LSTM initialization and Subroutine 12 for the LSTM evaluation.

TABLE 18

Subroutine 11: LSTM initialization

1. Iq_m(bs, m0) //Input queue -> matrix address "m0"
2. Iq_m(bs, m1)
3. Iq_m(bs, m2)
4. Iq_m(bs, m3)
5. Iq_v(bs, b_0_mfu0, MFU0) //Input queue -> MFUO's LVRF address "b_0_mfu0"
6. Iq_v(bs, b_1_mfu0, MFU0)

TABLE 19

Subroutine 12: LSTM evaluation

1. //Chain A
2. iq_v(bs, FGDST(input), NO_MFU) //Input queue to GVRF address "input" and chain to MVU
3. mv_mul(bs, PREV, m0, ACC) //Accept vector from previous, multiply by m0, store locally
4. //Chain B
5. //VV_ADD 1 is implicit in the next instruction
6. mv_mul(bs, GSRC(history), m1, NEXT) //Load "history", multiply by m1, sum with local, forward
7. //MFU 1
8. vv_add(bs, PREV, b_0_mfu0, NEXT) //Accept a vector, add to local bias vector 0, forward
9. //MFU 1
10. v_sigm(bs, PREV, NEXT) //Accept a vector, apply sigmoid, forward
11. //MFU 2
12. v_lstore(bs, u_mfu2) //Store the result in MFU 2's local memory
13. //Chain C
14. mv_mul(bs, m2, input ACC)
15. //Chain D
16. mv_mul(bs, m3, history, NEXT)
17. //MFU0
18. vv_add(bs, PREV, b_1_mfu0, NEXT)
19. //MFU1
20. v_sigm(bs, PREV, NEXT)
21. //MFU2
22. vv_mul(bs, PREV, u_mfu2, NEXT)
23. //MFU3
24. v_pass(bs, PREV)
25. //MFU4

TABLE 19-continued

Subroutine 12: LSTM evaluation 26. v_pass(bs, PREV)
27. //Output Queue
28. oq_v(bs, PREV)

Figure 12:
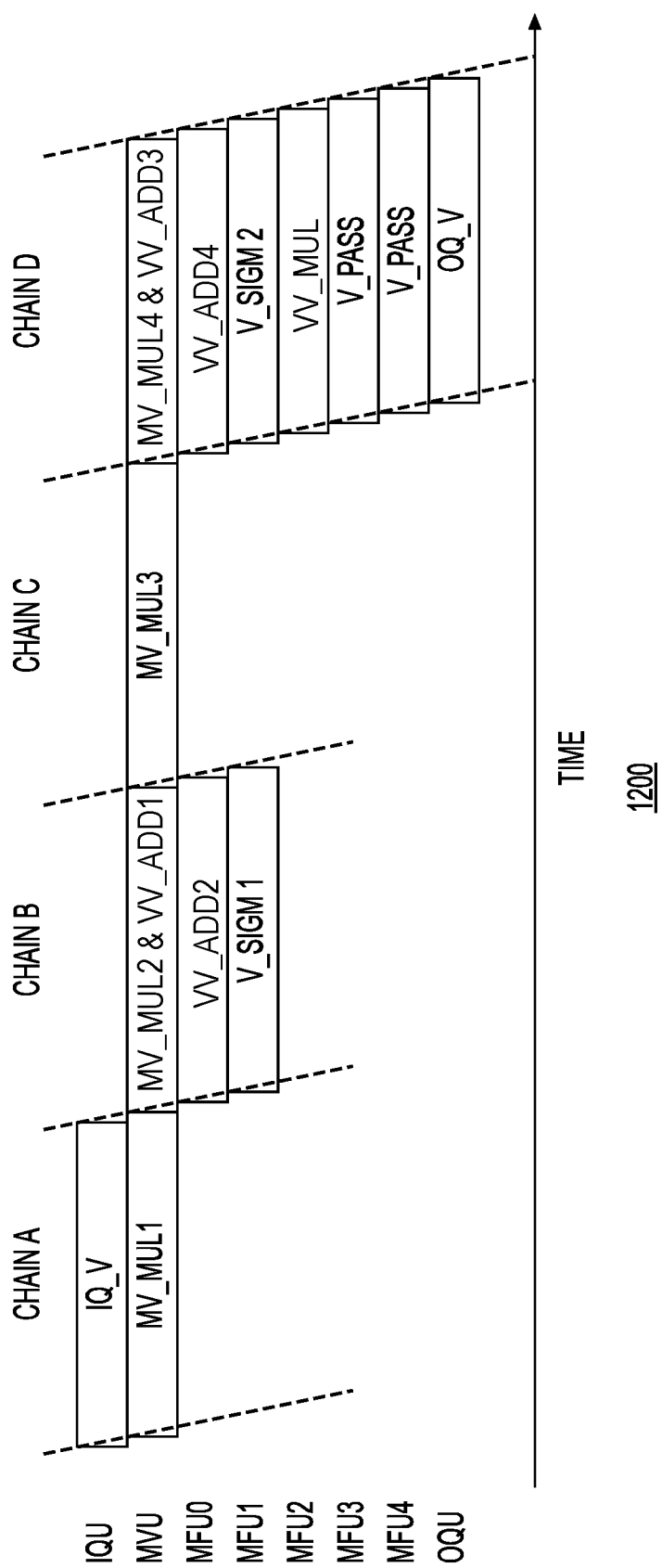
FIG. 12 shows an example processing of a chain of instructions by a neural functional unit in accordance with one example.

FIG. 12 shows an example processing 1200 of a chain of instructions by a neural functional unit in accordance with one example. In addition, referring to FIG. 12, an approximate graph of total execution time for the Subroutine 12 is shown. As explained earlier, once the instruction chains (Chains A-D) have been mapped by a control processor (e.g., Control/Scalar Processor of FIG. 3), the instructions are processed in a pipelined fashion from left to right (e.g., the pipeline comprising an MVU and five MFUs shown in FIG. 4). Thus, Chain A includes the processing of the MV_MUL1 instruction after an input vector is loaded into the matrix register file corresponding to the MVU. Chain B includes the processing of the instructions MV_MUL2 and W_ADD1 in parallel by the MVU and MFU0. At the same time, the W_ADD2 and V_SIGM1 are processed using, for example, MFU1 and MFU2. Chain C (which includes only one instruction—MV_MUL3) is processed by the MVU. Finally, Chain D is processed by the entire pipeline. The MVU processes both MV_MUL4 and W_ADD3 at the same time and the MFUs process the remaining instructions in Chain D, in parallel, including the two instructions V_PASS that simply pass the input received from the previous MFU to the next MFU or the output queue (OQ). In this example, the total execution time is largely driven by MV_MUL instructions, while the other vector operations are all pipelined to the MV_MULs. And W_ADD 1 and W_ADD3 take place within the MVU's accumulation registers.

In another LSTM implementation two additional steps are performed before the processing of the vector data and the scalar data by the NFU. First, a loop is used to unroll the LSTM against a number of iterations provided by each request. Second, matrix blocking is used to map algorithmic matrix and vector sizes to the processor that may have a different native size. In this example, we have an HWVEC_ELEMS of 250, while the algorithmic input vectors are size 200, the rest of the algorithmic vectors are size 500, the algorithmic input matrices are 500×200, and the algorithmic history matrices are 500×500. Therefore, the input matrix-vector multiply is blocked into two MV_MUL( ) calls (using some zero padding), while the history matrix-vector multiplies are blocked into four MV_MUL( ) calls and two VV_ADD( ) calls.

As part of this example, there are three subroutines: one to initialize a set of matrices, one to initialize bias vectors, and one to perform LSTM evaluation on a set of vectors. As an example, at startup time one usage scenario would be to call matrix init (e.g., Subroutine 13 in Table 20) 3 times on 8 matrices each to load the 24 matrices, then call bias vector init (e.g., Subroutine 14 in Table 21) once. Then, at runtime, in this example, LSTM evaluation (e.g., Subroutine 15 in Table 22) would be called for each query.

TABLE 20

Subroutine 13: LSTM Weights Matrix Initialization 1.  const int num_matrices = ActiveInputMessage.A[1];
2.  const int start_maddr = ActiveInput
3.  int i;
4.  for (i = start_maddr; i < num_matrices + start_maddr; i++)
5.  {
6.      iq_m(bs, i);
7.  }

TABLE 21

Subroutine 14: LSTM Bias Vector Initialization 1.  iq_v(bs, b_i_mfu0[0], MFU0);
2.  iq_v(bs, b_i_mfu0[1], MFU0);
3.  iq_v(bs, b_f_mfu0[0], MFU0);
4.  iq_v(bs, b_f_mfu0[1], MFU0);
5.  iq_v(bs, b_c_mfu0[0], MFU0);
6.  iq_v(bs, b_c_mfu0[1], MFU0);
7.  iq_v(bs, b_o_mfu0[0], MFU0);
8.  iq_v(bs, b_o_mfu0[1], MFU0);

TABLE 22

Subroutine 15: LSTM Evaluation

```
VOID BS_LSTM_Eval ( )
{
    const int iterations = ActiveInputMessage.Aux[1];
    int i, j;
    for (i = 0; i < iterations; i++)
    {
        //
        //Produce i_t
        //
        //Start chain
        iq_v(bs, FGDST(x_curr), NO_MFU) ;
        for (j = 0; j < 2; j++)
        {
            if (i == 0)
            {
                //Continue chain
                if (j == 0) mv_mul(bs, PREV, W+xi[j], NEXT) ;
                else mv_mul(bs, GSRC(x_curr), W_xi[j], NEXT) ;
            }
            else
            {
```

TABLE 22-continued

| Subroutine 15: LSTM Evaluation |
|---|

```
                //End chain
                if (j == 0) mv_mul(bs, PREV, W_xi[j], ACC) ;
                else mv_mul(bs, GSRC(x_curr), W_xi[j], ACC) ;
                mv_mul(bs, GSRC(h_prev[0], W_hi[j*2], ACC) ;
                //Start chain
                mv_mul(bs, GSRC(h_prev[1]), W_hi[j*2+1] , NEXT) ;
            }
            //MFU0
            vv_add(bs, PREV, LSRC(b_i_m0[j]), NEXT) ;
            //MFU1
            v_sigm(bs, PREV, NEXT) ;
            //MFU2 (end chain)
            V_lstore(bs, LDST(i_t_m2[j])) ;
        }
        //
        //Produce f_t
        //
        for (j = 0; j < 2; j++)
        {
            if (i == 0)
            {
                //Start chain
                mv_mul(bs, GSRC(x_curr), W_xi[j], NEXT) ;
            }
            else
            {
                mv_mul(bs, GSRC(x_curr), W_xi[j], ACC) ;
                mv_mul(bs, GSRC(h_prev[0]), W_hf[j*2], ACC) ;
                //Start chain
                mv_mul(bs, GSRC(h_prev[1]), W_hf[j*2+1], NEXT) ;
            }
            //MFU0
            vv_add(bs, PREV, LSRC(b_f_m0[j]), NEXT) ;
            //MFU1
            v_sigm(bs, PREV, NEXT) ;
            //MFU2
            v_pass(bs, PREV) ;
            //MFU 3 (end chain)
            if (I == 0) vv_mul(bs, PREV, LSRC(zeroes_m3),
LDST(mul_f_t_m2[j])) ;
            else vv_mul(bs, PREV, LSRC(c_prev_m3[j]),
LDST)mul_f_t_m3[j])) ;
        }
        //
        //Produce c_t
        //
        for (j = 0; j < 2; j++)
        {
            if (i == 0)
            {
                //Start chain
                mv_mul(bs, GSRC(x_curr), W_xi[j], NEXT) ;
            }
            else
            {
                mv_mul(bs, GSRC(x_curr), W_xc[j], ACC) ;
                mv_mul(bs, GSRC(h_prev[0]), W_hc[j*2], ACC) ;
                //Start chain
                mv_mul)bs, GSRC(h_prev[1]), W_hc[j*2+1], NEXT) ;
            }
            //MFU0
            vv_add(bs, PREV, LSRC(b_c_m0[j]), NEXT) ;
            //MFU1
            v_tanh(bs, PREV, NEXT) ;
            //MFU2
            vv_mul(bs, PREV, LSRC(i_t_m2[j]), NEXT) ;
            //MFU3
            vv_add(bs, PREV, LSRC(mul_f_t_m3[j]),
FLDST(c_prev_m3[j])) ;
            //MFU4
            v_tanh(bs, PREV, LDST(tanh_c_t_,4[j])) ;
        }
        //
        //Produce o_t
        //
```

TABLE 22-continued

Subroutine 15: LSTM Evaluation

```
            for (j = 0; j < 2; j++)
            {
                    if (i == 0)
                    {
                            //Start chain
                            mv_mul(bs, GSRC(x_curr), W_xi[j], NEXT) ;
                    }
                    else
                    {
                            mv_mul(bs, GSRC(x_curr), W_xo[j], ACC) ;
                            mv_mul(bs, GSRC(h_prev[1]), W-ho[j*2+1], NEXT) ;
                    }
                    //MFU0
                    vv_add(bs, PREV, NEXT) ;
                    //MFU1
                    v_sigm(bs, PREV, NEXT) ;
                    //MFU2
                    v_pass(bs, PREV) ;
                    //MFU3
                    v_pass(bs, PREV) ;
                    //MFU4 (end chain)
                    if (i == iterations - 1)
                    {
                            //Store h_prev back to GVRF and send externally
                            vv_mul(bs, PREV, LSRC(tanh_c_t_m4[j]),
FGDST(h_prev[j])) ;
                    }
                    else
                    {
                            //Just store h_prev
                            vv_mul(bs, PREV, LSRC(tanh_c_t_m4[j]),
GDST(h_prev[j])) ;
                    }
            }
        }
}
```

Although the subroutine examples described above provide a respective set of instructions to illustrate the various embodiments, the respective sets of instructions may include more or fewer instructions. In addition, these instructions may be performed in a different order. In addition, although several parameters are described for configuring or controlling various aspects of the nodes and the processing by the nodes, these parameters are only examples. Additional or fewer parameters may be used with different versions of the examples discussed in this disclosure.

Figure 13:
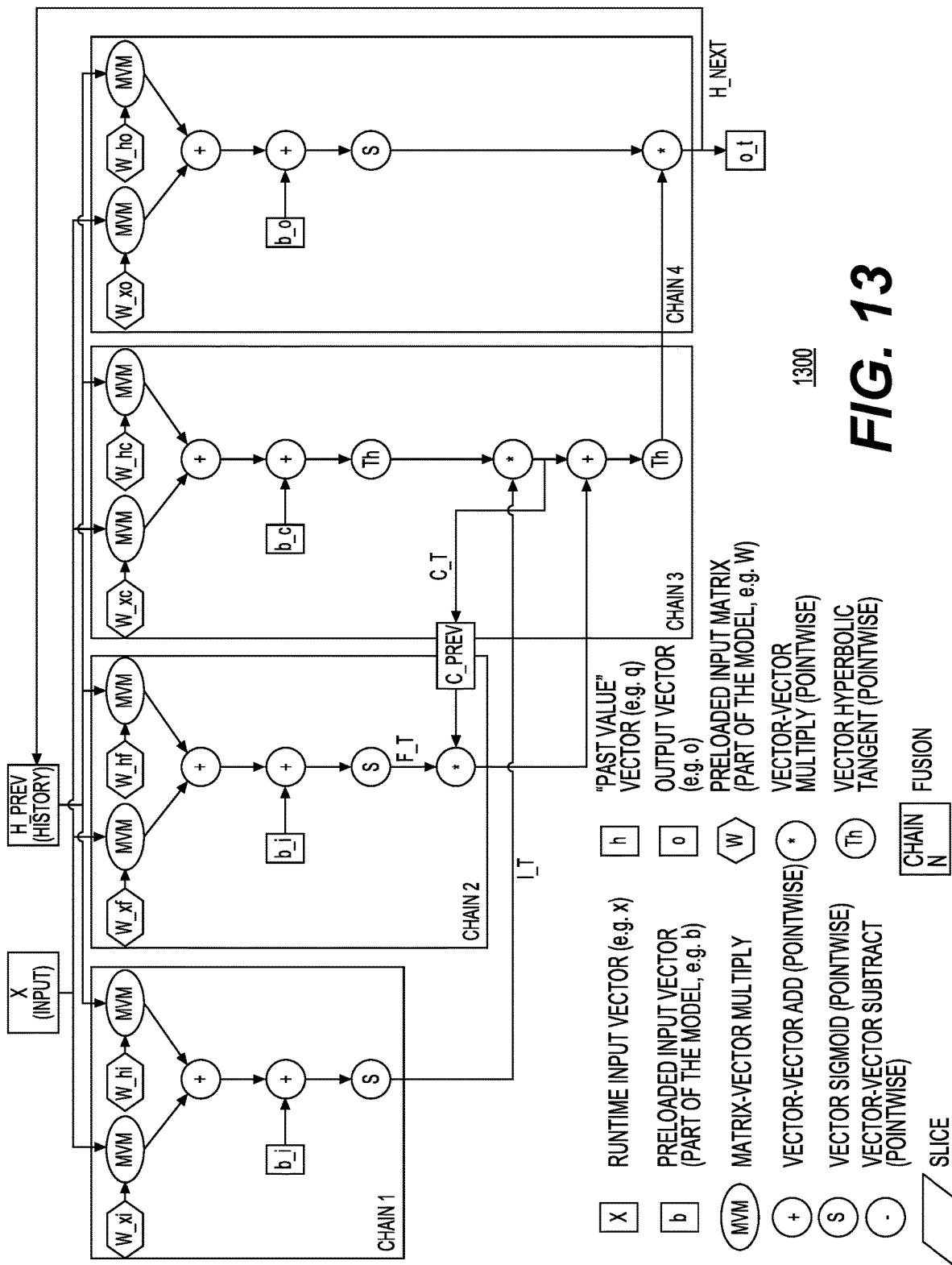
FIG. 13 shows a data flow graph for a neural network evaluation in accordance with one example.

FIG. 13 shows a data flow graph 1300 for a neural network evaluation in accordance with one example. Data flow graph 1300 includes four chains of instructions: CHAIN 1, CHAIN 2, CHAIN 3, and CHAIN 4. CHAIN 1 includes performing a matrix multiply operation between runtime input vectors (e.g., X) and weights (e.g., W_xi, which may correspond to the neural network model) corresponding to the neural network model. CHAIN 1 further includes performing a matrix multiply operation between past values of input vectors (e.g., H_PREV) and historical weights (e.g., W_hi). The multiplication outputs may be added using pointwise addition of the vectors. Next, as part of CHAIN 1, a sigmoid operation may be performed. As part of CHAIN 2, a matrix multiply operation may be performed between the forget gate weight matrix (e.g., W_xf) and runtime input vectors (e.g., X). CHAIN 2 further includes performing a matrix multiply operation between past values of input vectors (e.g., H_PREV) and historical forget gate weight matrix (e.g., W_hf). The multiplication outputs may be added using pointwise addition of the vectors. Next, as part of CHAIN 2, bias input vector (e.g., b_i) may be added to the output of the addition operation. Next, as part of CHAIN 2, sigmoid operation may be performed. Turning now to CHAIN 3, as part of CHAIN 3, a matrix multiply operation may be performed between the cell gate weight matrix (e.g., W_xc) and runtime input vectors (e.g., X). CHAIN 3 further includes performing a matrix multiply operation between past values of input vectors (e.g., H_PREV) and historical cell gate weight matrix (e.g., W_hc). The multiplication outputs may be added using pointwise addition of the vectors. Next, as part of CHAIN 3, bias cell gate vector (e.g., b_c) may be added to the output of the addition operation. Next, as part of CHAIN 3, a hyperbolic function operation may be performed. Regarding CHAIN 4, a matrix multiply operation may be performed between the output gate weight matrix (e.g., W_xo) and runtime input vectors (e.g., X). CHAIN 4 further includes performing a matrix multiply operation between past values of input vectors (e.g., H_PREV) and historical output gate weight matrix (e.g., W_ho). The multiplication outputs may be added using pointwise addition of the vectors. Next, as part of CHAIN 4, bias output gate vector (e.g., b_o) may be added to the output of the addition operation. Next, as part of CHAIN 4, a sigmoid operation may be performed. Additional operations may be performed on the outputs of the four chains. Although FIG. 13 shows a certain number of operations being performed using a certain number of chains, additional or fewer operations may be performed using a different number of chains may be performed.

Figure 14:
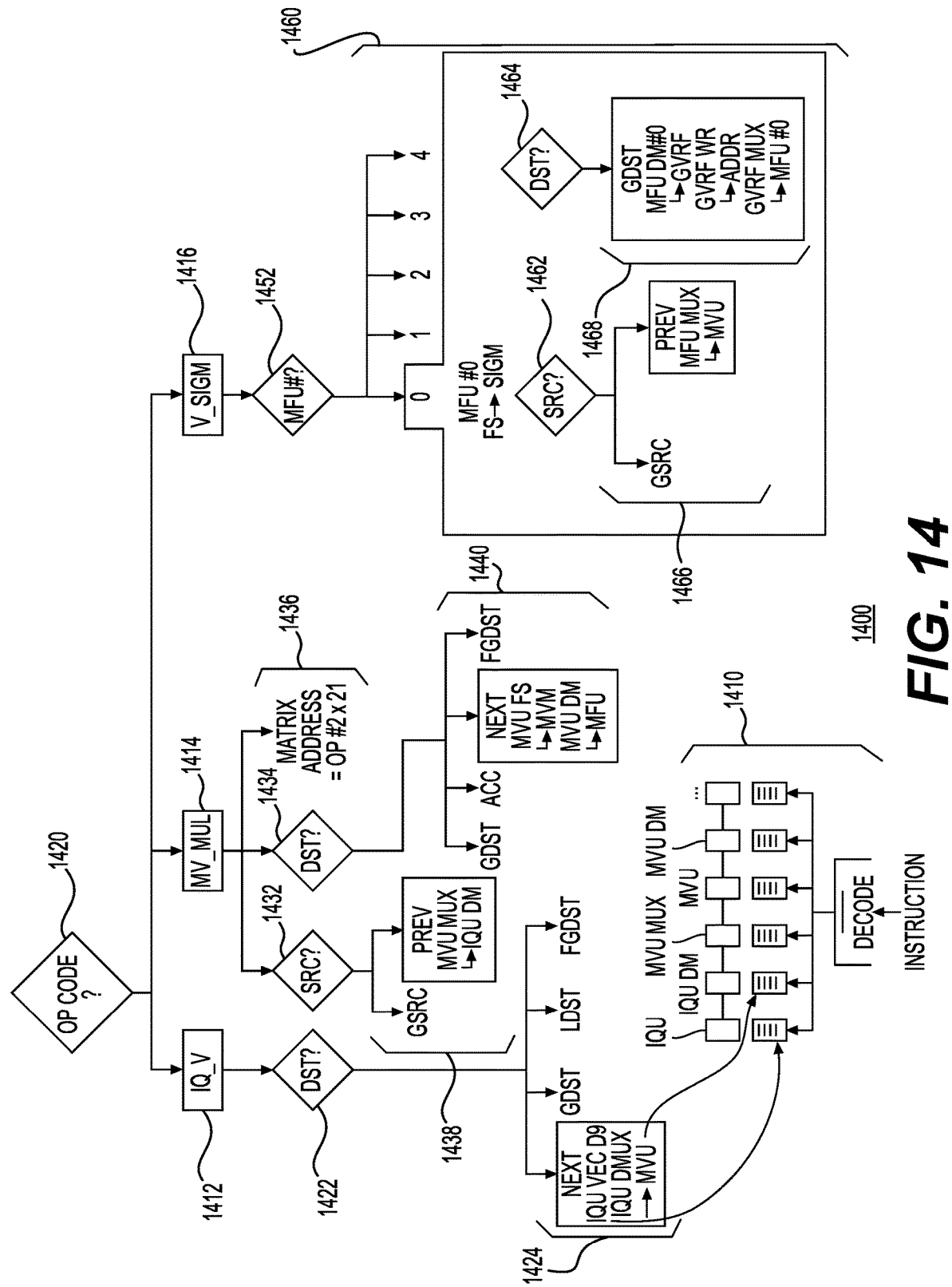
FIG. 14 shows a diagram of how chains of instructions may be processed using a hardware node (e.g., an FPGA) in accordance with one example.

FIG. 14 shows a diagram of how chains of instructions may be processed using a hardware node (e.g., an FPGA) in accordance with one example. The example processing 1400 may be implemented using architecture corresponding to the hardware nodes described earlier. As shown via processing aspect 1410, a control processor (e.g., control/scalar processor 320 of FIG. 3) may be configured to receive and decode instructions received from a queue. As part of processing aspect 1410, received instructions are processed such that they fanout into independent control queues, such as various queues shown in FIG. 14 as part of block 1410. In one example, the independent control queues may determine which portion of a neural function unit (e.g., any of the NFUs described earlier) gets activated. Each of the processing units, including the MVU and the MFUs will see the head of a control queue associated with that unit. In this example, having independent control queues for the various processing elements may allow for the chains of instructions to be processed in parallel to the extent an input to a chain does not rely upon an output from another chain. In addition, with respect to the MFUs, the various multiplexers, control gates, or other similar structures will be activated based on the respective control signals issued by a respective control queue. As an example, an addition block of an MFU may receive the inputs via a bitstream being input to the hardware node when the multiplexor controlling input to the addition block of the MFU is allowed to pass through the inputs. In one example, a bitstream may represent a lookup table's contents and their connections. The queue inputting data to the addition block may not be de-queued until all of the vectors have passed through. Intermediate outputs generated during the execution of a respective chain may be stored in the local vector register files corresponding to the relevant MVU or MFU. A subsequent instruction from the respective chain can then pick up that value for further consumption. Most instructions may include a set of arguments: a source, a destination, and optionally a second source. Each source and destination argument may use one of the argument types from Table 4, described earlier. As an example, a DST argument implies that the output of an instruction can be forwarded, stored globally, or stored locally, whereas a GDST argument implies that the output of the instruction can only be stored globally (e.g., as part of the relevant GVRF register). In one example, only those instructions that can take an input from a GSRC can be appended to a chain and only those instructions that can supply a DST argument can pass data down to another chain.

Referring to the example shown in FIG. 14, once the opcode associated with an instruction at decision block 1420 is decoded, then it may be determined which target functional unit is targeted by the instruction. If the instruction targets the Input Queue (IQ_V (block 1412)), and the argument is DST (block 1422), then the hardware node logic may move the next vector into the NFU through the Input Queue into DST (block 1424). If the argument associated with the instruction is GDST (global DST), then the next vector may be moved into a global register as per the address associated with the GDST. If the argument associated with the instruction is LDST (local DST), then the next vector may be moved into a local register as per the address associated with the LDST. If the argument associated with the instruction is FGDST, then the next vector may be moved into a global register as per the address associated with the FGDST.

With continued reference to FIG. 14, if the instruction targets the matrix vector-multiply unit (MVU) (e.g., MV_MUL (block 1414)), the logic associated with the hardware node may take steps associated with multiplying a matrix obtained from a register or a specified address. MV_MUL instruction may include multiplying a matrix at MSRC by a vector from GSRC and deliver it to DST. Local storage may take place in the accumulation registers and is mutually exclusive with forwarding. With respect to the source of the vector data, as part of block 1432, the logic associated with the hardware node may determine whether the source of the data is GSRC or the output from another matrix multiply operation (block 1438). Depending on the source, the vector data may be provided to the MVU. Alternatively, if the source of the vector data is a specific address (e.g., OP#2X21 (block 1436)), then the vector data may be loaded from that source and provided to the MVU. In addition, regarding the destination of the vector data, if the argument associated with the instruction is GDST (global DST), then the next vector may be moved into a global register as per the address associated with the GDST. Intermediate results may be locally stored in an accumulator (ACC). Advantageously, in one example, no results may be stored as intermediate results, and instead they may be forwarded directly to the next MVU (as shown in block 1440). If the argument associated with the instruction is FGDST, then the next vector may be moved into a global register as per the address associated with the FGDST.

Referring still to FIG. 14, if the instruction is a sigmoid operation (V_SIGM (block 1416)) and thus it targets one of the MFUs, the logic associated with the hardware node may determine which one of the MFUs (e.g., MFU #0, MFU #1, MFU #2, MFU #3, or MFU #4) is targeted (block 1452). In the example, shown in FIG. 14, the instruction is targeting MFU #0 for the sigmoid operation. As part of block 1460, additional processing may be done by the logic associated with the hardware node. As an example, at block 1462, the logic associated with the hardware node may determine whether the source of the data is GSRC or the output from another source (block 1438). Depending on the source, the vector data may be provided from the GSRC or the other source (block 1466). A pointwise sigmoid operation may be performed on the vector data (obtained, for example, from the GSRC) and delivered to DST. At block 1464, the logic associated with the hardware node may determine the destination of the output. The data may be provided to any of the destinations as listed in block 1468. Although FIG. 14 shows certain series of actions related to instructions chained in a certain manner, other actions may be performed. In addition, the data may be obtained from other sources than described in FIG. 14 and may be provided to other destinations than described in FIG. 14.

FIG. 15 shows a flow diagram 1500 of a method for processing instructions in accordance with one example. In one example, the method may be performed using a processor including a pipeline for processing instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The method may include a step (e.g., step 1520) including decoding a chain of instructions received via an input queue, wherein the chain of instructions comprises a first instruction that can only be processed by the matrix vector unit and a sequence of instructions that can only be processed by a multifunction unit. The processor may correspond to any of the neural function units described earlier.

The method may further include a step (e.g., step 1530) including processing the first instruction using the matrix vector unit and processing each of instructions in the sequence of instructions depending upon a position of the each of instructions in the sequence of instructions, such that an instruction that is in a first position in the sequence of the plurality of instructions is processed by the first multifunction unit, an instruction that is in a second position in the sequence of instructions is processed by the second multifunction unit, and an instruction that is in a third position in the sequence of instructions is processed by the third multifunction unit. Thus, for the first instruction that targets the matrix vector-multiply unit (MVU) (e.g., as shown in FIG. 14, MV_MUL (block 1414)), the logic associated with the hardware node may take steps associated with multiplying a matrix obtained from a register or a specified address. For the instructions in the sequence of instructions targeting a multifunction unit, the logic associated with the hardware node may determine which one of the MFUs (e.g., MFU #0, MFU #1, MFU #2, MFU #3, or MFU #4) is targeted based on a position of the instruction in the sequence of the instructions. In one example, this step may be performed by a control processor associated with any of the NFUs described earlier. In one example, the control processor, which may be adjacent to the pipeline, may have a queue of instructions and it can write the instructions dynamically into the relevant queues for the various components of the NFU. As the instructions are executed they may fan out into independent control queues and that may determine which part of the NFU gets activated. Each of the components of the NFU may access the head of the control queue and perform an operation, for example, an add, multiply, tangent, sigmoid, or NOP accordingly.

In conclusion, the present disclosure relates to a method in a processor including a pipeline for processing instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The method may include decoding a chain of instructions received via an input queue, wherein the chain of instructions comprises a first instruction that can only be processed by the matrix vector unit and a sequence of instructions that can only be processed by a multifunction unit. The method may further include processing the first instruction using the matrix vector unit and processing each of instructions in the sequence of instructions depending upon a position of the each of instructions in the sequence of instructions, such that an instruction that is in a first position in the sequence of the plurality of instructions is processed by the first multifunction unit, an instruction that is in a second position in the sequence of instructions is processed by the second multifunction unit, and an instruction that is in a third position in the sequence of instructions is processed by the third multifunction unit.

The local memory used by an instruction in the sequence of instructions may be implicitly determined based on a position of the instruction in the sequence of the plurality of instructions. In one example, the local memory used by the instruction may be a local register file having only one read port and only one write port. In one example, a local memory used by the instruction that is in the first position in the sequence of instructions is implicitly determined as a first local register file corresponding to the first multifunction unit. Similarly, in this example, a local memory used by the instruction that is in the second position in the sequence of instructions is implicitly determined as a second local register file corresponding to the second multifunction unit and a local memory used by the instruction that is in the third position in the sequence of instructions is implicitly determined as a third local register file corresponding to the third multifunction unit. In this example, each of the first multifunction unit, the second multifunction unit, and the third multifunction unit may further comprise a pointwise addition block, a pointwise multiplication block, a sigmoid block, a hyperbolic tangent block, and a no-operation block. In one example, the first instruction may be a vector type of instruction and each of the sequence of instructions may be a scalar type of instruction.

In another example, the present disclosure relates to a processor including a pipeline configured to process instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The processor may further include a decoder configured to decode a chain of instructions received via an input queue, where the chain of instructions comprises a first instruction that can only be processed by the matrix vector unit and a sequence of instructions that can only be processed by a multifunction unit. The processor may further include a controller configured to map the first instruction for processing using the matrix vector unit and map each of instructions in the sequence of instructions for processing depending upon a position of the each of instructions in the sequence of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

In one example, local memory used by an instruction in the sequence of instructions may be implicitly determined based on a position of the instruction in the sequence of the plurality of instructions. In this example, the local memory used by the instruction may comprise a local register file having only one read port and only one write port. In this example, a local memory used by the instruction that is in the first position in the sequence of instructions may be implicitly determined as a first local register file corresponding to the first multifunction unit. Similarly, in this example, a local memory used by the instruction that is in the second position in the sequence of instructions is implicitly determined as a second local register file corresponding to the second multifunction unit and a local memory used by the instruction that is in the third position in the sequence of instructions is implicitly determined as a third local register file corresponding to the third multifunction unit. In this example, each of the first multifunction unit, the second multifunction unit, and the third multifunction unit may further comprise a pointwise addition block, a pointwise multiplication block, a sigmoid block, a hyperbolic tangent block, and a no-operation block. In one example, the first instruction may be a vector type of instruction and each of the sequence of instructions may be a scalar type of instruction.

In yet another example, the present disclosure relates to a system including an input message processor configured to process incoming messages, wherein the input message processor is further configured to split the incoming messages into a first set of messages and a second set of messages. The system may further include a scalar processor configured to process both the first set of messages and the second set of messages. The system may further include a scalar processor configured to process the first set of messages and not the second set of messages. The system may further include neural function unit configured to process instructions placed in a plurality of queues by the scalar processor on input data received at least via the second set of messages. The neural function unit may further include a pipeline configured to process the instructions, the pipeline including a matrix vector unit, a first multifunction unit, where the first multifunction unit is connected to receive an input from the matrix vector unit, a second multifunction unit, where the second multifunction unit is connected to receive an output from the first multifunction unit, and a third multifunction unit, where the third multifunction unit is connected to receive an output from the second multifunction unit. The neural function unit may further include a decoder configured to decode a chain of instructions received via an input queue, where the chain of instructions comprises a first instruction that can only be processed by the matrix vector unit and a sequence of instructions that can only be processed by a multifunction unit. The neural function unit may further include a controller configured to map the first instruction for processing using the matrix vector unit and map each of instructions in the sequence of instructions for processing depending upon a position of the each of instructions in the sequence of the plurality of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

In this example, a local memory used by an instruction in the sequence of the plurality of instructions may be implicitly determined based on a position of the instruction in the sequence of instructions. In this example, the local memory used by the instruction may be a local register file having only one read port and only one write port. In this example, each of the first multifunction unit, the second multifunction unit, and the third multifunction unit may further comprise a pointwise addition block, a pointwise multiplication block, a sigmoid block, a hyperbolic tangent block, and a no-operation block.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method in a processor including a pipeline for processing instructions, the pipeline including a matrix vector unit, a first multifunction unit, wherein the first multifunction unit is connected to receive an input from the matrix vector unit, a second multifunction unit, wherein the second multifunction unit is connected to receive an output from the first multifunction unit, and a third multifunction unit, wherein the third multifunction unit is connected to receive an output from the second multifunction unit, the method comprising:

decoding a chain of instructions received via an input queue, wherein the chain of instructions comprises a first instruction that can only be processed by the matrix vector unit and a sequence of instructions that can only be processed by a multifunction unit; and processing the first instruction using the matrix vector unit and processing each of instructions in the sequence of instructions depending upon a position of the each of instructions in the sequence of instructions, such that an instruction that is in a first position in the sequence of the plurality of instructions is processed by the first multifunction unit, an instruction that is in a second position in the sequence of instructions is processed by the second multifunction unit, and an instruction that is in a third position in the sequence of instructions is processed by the third multifunction unit.

2. The method of claim 1, wherein a local memory used by an instruction in the sequence of instructions is implicitly determined based on a position of the instruction in the sequence of the plurality of instructions.

3. The method of claim 2, wherein the local memory used by the instruction comprises a local register file having only one read port and only one write port.

4. The method of claim 1, wherein a local memory used by the instruction that is in the first position in the sequence of instructions is implicitly determined as a first local register file corresponding to the first multifunction unit.

5. The method of claim 4, wherein a local memory used by the instruction that is in the second position in the sequence of instructions is implicitly determined as a second local register file corresponding to the second multifunction unit.

6. The method of claim 5, wherein a local memory used by the instruction that is in the third position in the sequence of instructions is implicitly determined as a third local register file corresponding to the third multifunction unit.

7. The method of claim 1, wherein each of the first multifunction unit, the second multifunction unit, and the third multifunction unit further comprises a pointwise addition block, a pointwise multiplication block, a sigmoid block, a hyperbolic tangent block, and a no-operation block.

8. The method of claim 1, wherein the first instruction comprises a vector type of instruction and each of the sequence of instructions comprises a scalar type of instruction.

9. A processor comprising:
a pipeline configured to process instructions, the pipeline including a matrix vector unit, a first multifunction unit, wherein the first multifunction unit is connected to receive an input from the matrix vector unit, a second multifunction unit, wherein the second multifunction unit is connected to receive an output from the first multifunction unit, and a third multifunction unit, wherein the third multifunction unit is connected to receive an output from the second multifunction unit; and
a decoder configured to decode a chain of instructions received via an input queue, wherein the chain of instructions comprises a first instruction that can only be processed by the matrix vector unit and a sequence of instructions that can only be processed by a multifunction unit; and
a controller configured to map the first instruction for processing using the matrix vector unit and map each of instructions in the sequence of instructions for processing depending upon a position of the each of instructions in the sequence of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

10. The processor of claim 9, wherein a local memory used by an instruction in the sequence of instructions is implicitly determined based on a position of the instruction in the sequence of the plurality of instructions.

11. The processor of claim 10, wherein the local memory used by the instruction comprises a local register file having only one read port and only one write port.

12. The processor of claim 9, wherein a local memory used by the instruction that is in the first position in the sequence of instructions is implicitly determined as a first local register file corresponding to the first multifunction unit.

13. The processor of claim 12, wherein a local memory used by the instruction that is in the second position in the sequence of instructions is implicitly determined as a second local register file corresponding to the second multifunction unit.

14. The processor of claim 13, wherein a local memory used by the instruction that is in the third position in the sequence of instructions is implicitly determined as a third local register file corresponding to the third multifunction unit.

15. The processor of claim 9, wherein each of the first multifunction unit, the second multifunction unit, and the third multifunction unit further comprises a pointwise addition block, a pointwise multiplication block, a sigmoid block, a hyperbolic tangent block, and a no-operation block.

16. The processor of claim 9, wherein the first instruction comprises a vector type of instruction and each of the sequence of instructions comprises a scalar type of instruction.

17. A system comprising:
an input message processor configured to process incoming messages, wherein the input message processor is further configured to split the incoming messages into a first set of messages and a second set of messages;
a scalar processor configured to process the first set of messages and not the second set of messages;
a neural function unit configured to process instructions placed in a plurality of queues by the scalar processor on input data received at least via the second set of messages, the neural function unit comprising:
a pipeline configured to process instructions, the pipeline including a matrix vector unit, a first multifunction unit, wherein the first multifunction unit is connected to receive an input from the matrix vector unit, a second multifunction unit, wherein the second multifunction unit is connected to receive an output from the first multifunction unit, and a third multifunction unit, wherein the third multifunction unit is connected to receive an output from the second multifunction unit;
a decoder configured to decode a chain of instructions received via an input queue, wherein the chain of instructions comprises a first instruction that can only be processed by the matrix vector unit and a sequence of instructions that can only be processed by a multifunction unit; and
a controller configured to map the first instruction for processing using the matrix vector unit and map each of instructions in the sequence of instructions for processing depending upon a position of the each of instructions in the sequence of the plurality of instructions, such that an instruction that is in a first position in the sequence of instructions is processed by the first multifunction unit, an instruction that is in a second position in the sequence of instructions is processed by the second multifunction unit, and an instruction that is in a third position in the sequence of instructions is processed by the third multifunction unit.

18. The system of claim 17, wherein a local memory used by an instruction in the sequence of the plurality of instructions is implicitly determined based on a position of the instruction in the sequence of instructions.

19. The system of claim 18, wherein the local memory used by the instruction comprises a local register file having only one read port and only one write port.

20. The system of claim 19, wherein each of the first multifunction unit, the second multifunction unit, and the third multifunction unit further comprises a pointwise addition block, a pointwise multiplication block, a sigmoid block, a hyperbolic tangent block, and a no-operation block.

* * * * *